(12) United States Patent
Suk et al.

(10) Patent No.: US 10,522,471 B2
(45) Date of Patent: Dec. 31, 2019

(54) SEMICONDUCTOR PACKAGE AND METHOD OF FABRICATING THE SAME

(71) Applicant: Samsung Electronics Co., Ltd., Suwon-si (KR)

(72) Inventors: Kyoung Lim Suk, Suwon-si (KR); Seokhyun Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/010,872

(22) Filed: Jun. 18, 2018

(65) Prior Publication Data
US 2019/0051607 A1 Feb. 14, 2019

(30) Foreign Application Priority Data
Aug. 10, 2017 (KR) .......................... 10-2017-0101832

(51) Int. Cl.
*H01L 23/495* (2006.01)
*H01L 23/538* (2006.01)
(Continued)

(52) U.S. Cl.
CPC ...... *H01L 23/5389* (2013.01); *H01L 21/4853* (2013.01); *H01L 21/4857* (2013.01); *H01L 21/561* (2013.01); *H01L 21/565* (2013.01); *H01L 21/6835* (2013.01); *H01L 23/145* (2013.01); *H01L 23/3114* (2013.01); *H01L 23/49811* (2013.01); *H01L 23/49894* (2013.01); *H01L 23/5383* (2013.01); *H01L 23/5386* (2013.01); *H01L 24/19* (2013.01); *H01L 24/20* (2013.01); *H01L 24/96* (2013.01); *H01L 25/105* (2013.01); *H01L 25/50* (2013.01);
(Continued)

(58) Field of Classification Search
CPC ............... H01L 21/565; H01L 21/4853; H01L 21/4857; H01L 21/561; H01L 21/6836; H01L 23/5389; H01L 23/5386; H01L 23/3114; H01L 23/5383; H01L 23/145; H01L 23/49811; H01L 23/49894; H01L 24/20; H01L 24/19; H01L 25/105
USPC ...................................................... 257/668
See application file for complete search history.

(56) References Cited

U.S. PATENT DOCUMENTS 5,172,212 A 12/1992 Baba
6,909,054 B2 * 6/2005 Sakamoto ........... H01L 21/4846
174/260

(Continued)

FOREIGN PATENT DOCUMENTS

JP 2017-034192 A 2/2017

OTHER PUBLICATIONS

Examination report dated Jan. 28, 2019 from the Singapore Patent Office in corresponding Singapore Patent Application.

*Primary Examiner* — Luan C Thai
(74) *Attorney, Agent, or Firm* — Muir Patent Law, PLLC

(57) ABSTRACT

Insulating layers of a redistribution layer of a semiconductor package may be formed as a polymer film having inorganic fillers formed therein. The inorganic fillers may trap reactive materials to inhibit and/or substantially prevent the metal conductors, such as chip pads of the semiconductor chip being packaged, from being damaged by the reactive material. As a result, the reliability and the durability of the semiconductor package may be improved.

23 Claims, 32 Drawing Sheets

(51) Int. Cl.
    *H01L 23/14*    (2006.01)
    *H01L 23/00*    (2006.01)
    *H01L 25/10*    (2006.01)
    *H01L 25/00*    (2006.01)
    *H01L 21/48*    (2006.01)
    *H01L 21/56*    (2006.01)
    *H01L 23/31*    (2006.01)
    *H01L 21/683*   (2006.01)
    *H01L 23/498*   (2006.01)

(52) U.S. Cl.
    CPC   *H01L 23/3128* (2013.01); *H01L 2221/68359* (2013.01); *H01L 2221/68368* (2013.01); *H01L 2224/0401* (2013.01); *H01L 2224/04105* (2013.01); *H01L 2224/12105* (2013.01); *H01L 2224/131* (2013.01); *H01L 2224/16238* (2013.01); *H01L 2224/214* (2013.01); *H01L 2224/2105* (2013.01); *H01L 2224/215* (2013.01); *H01L 2224/73204* (2013.01); *H01L 2224/81005* (2013.01); *H01L 2225/1035* (2013.01); *H01L 2225/1041* (2013.01); *H01L 2225/1058* (2013.01); *H01L 2924/01029* (2013.01); *H01L 2924/06* (2013.01); *H01L 2924/15311* (2013.01)

(56) References Cited

U.S. PATENT DOCUMENTS

| | | |
|---|---|---|
| 6,958,546 B2 | 10/2005 | Fan et al. |
| 7,033,923 B2 | 4/2006 | Seshan |
| 8,580,672 B2 | 11/2013 | Kuechenmeister et al. |
| 8,765,531 B2 | 7/2014 | Gatterbauer et al. |
| 9,472,515 B2 | 10/2016 | Meyer et al. |
| 9,780,069 B2 | 10/2017 | Haga et al. |
| 2002/0056906 A1 | 5/2002 | Kajiwara et al. |
| 2008/0246113 A1 | 10/2008 | Baek et al. |
| 2011/0278736 A1 | 11/2011 | Lin et al. |
| 2014/0035115 A1 | 2/2014 | Zenbutsu et al. |
| 2014/0242741 A1 | 8/2014 | Orita et al. |
| 2017/0365567 A1* | 12/2017 | Kim ............ H01L 23/3171 |

* cited by examiner

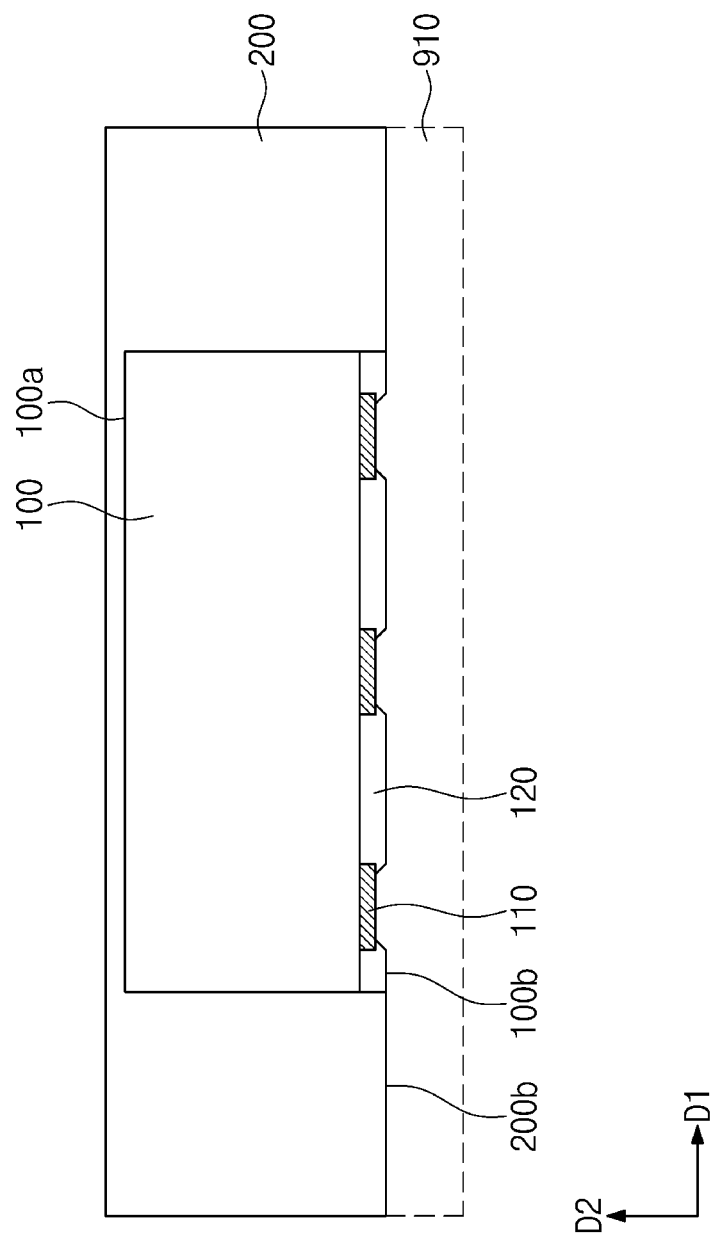

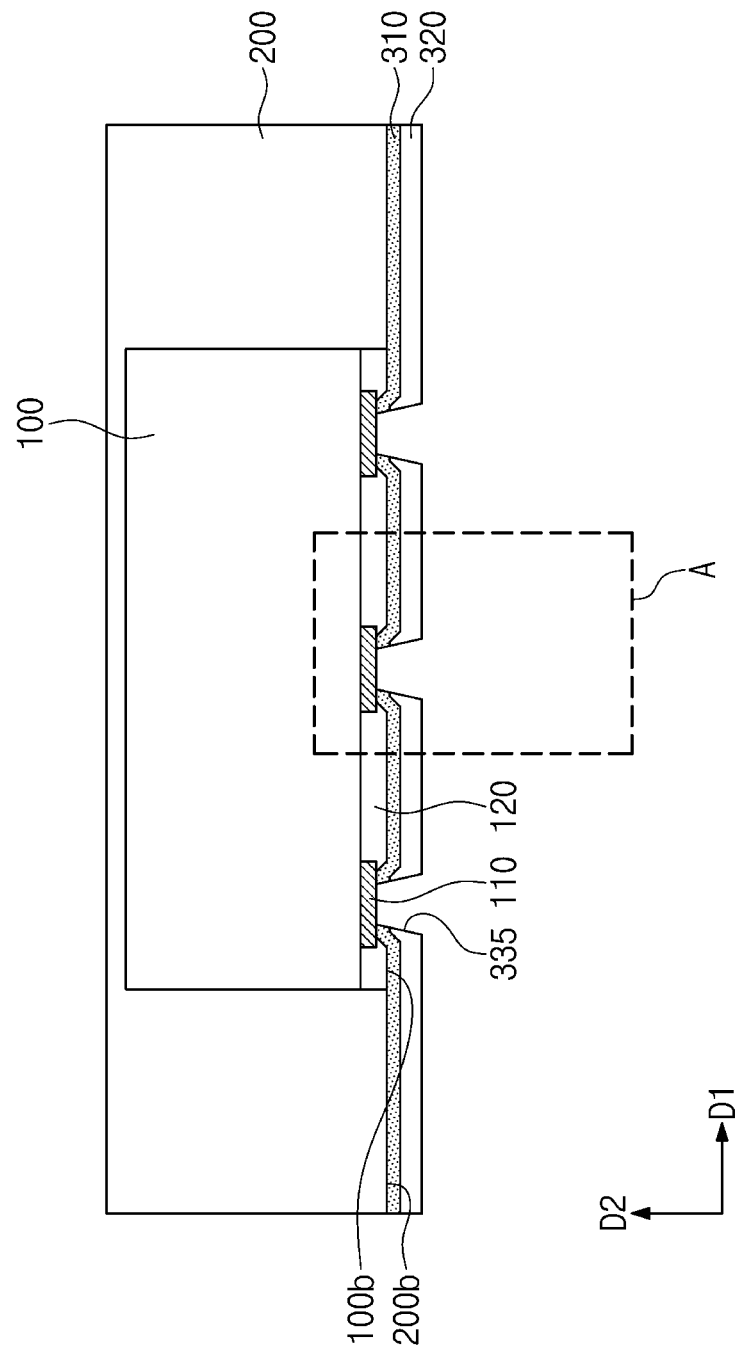

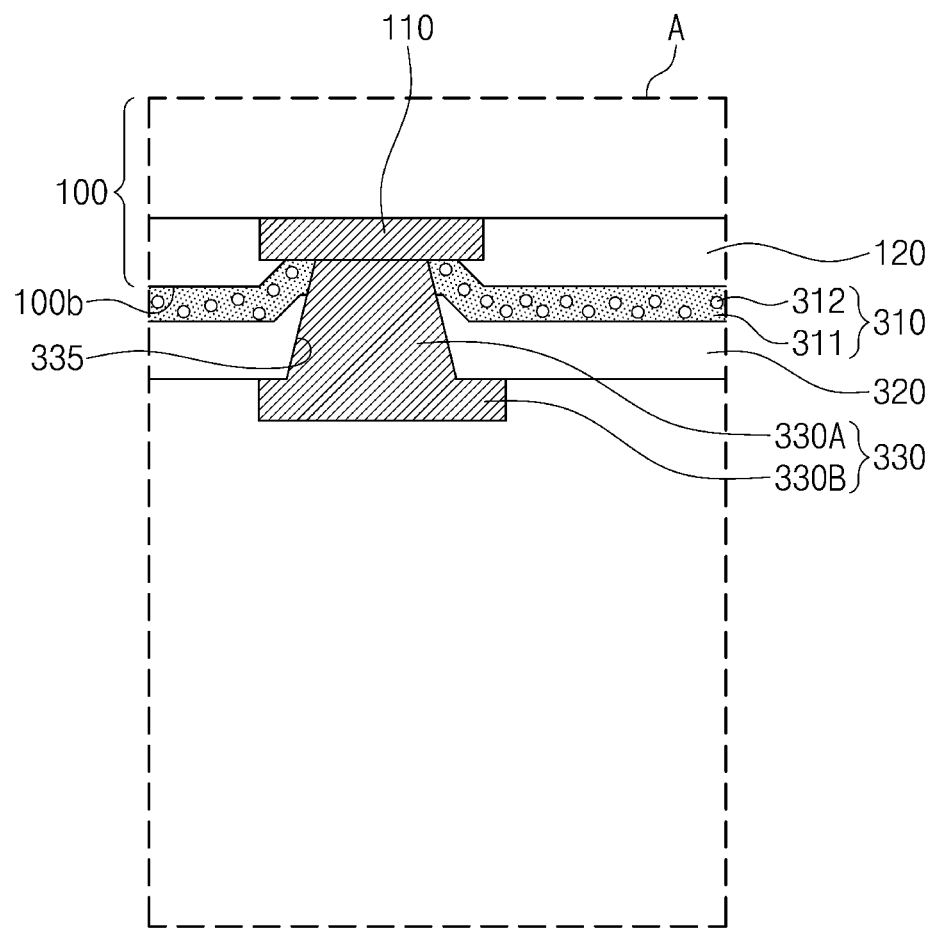

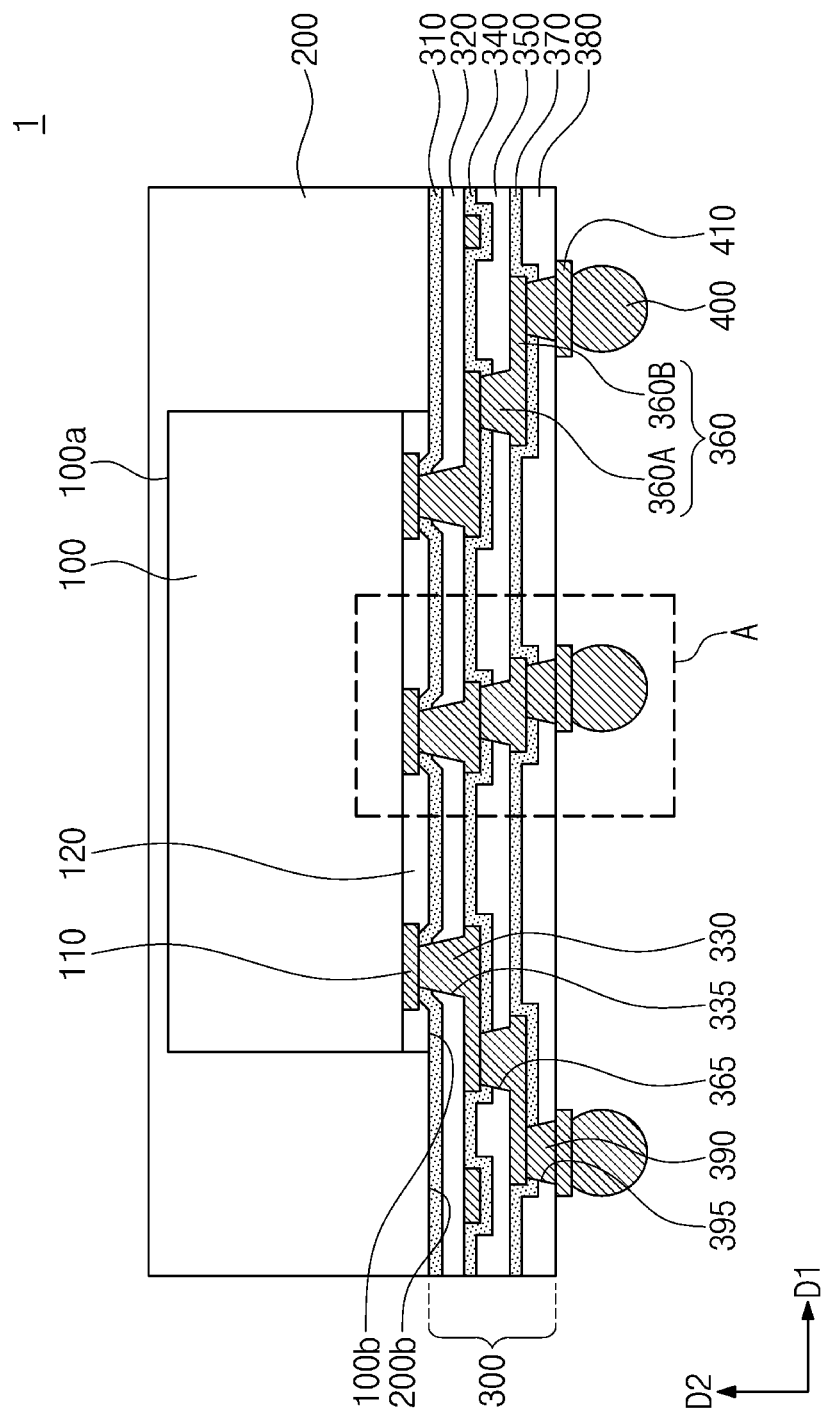

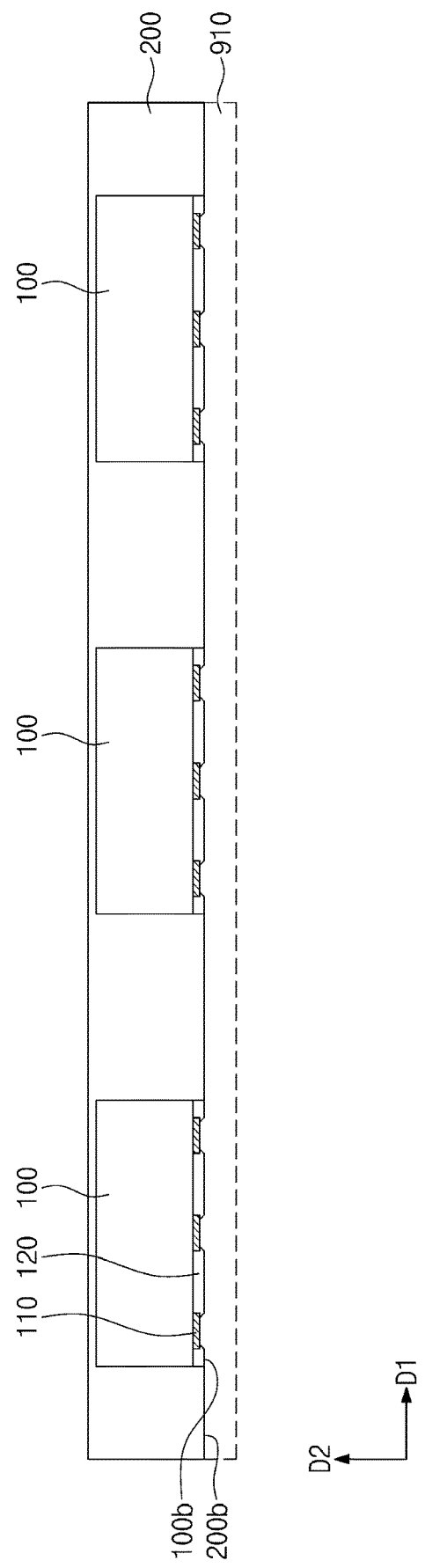

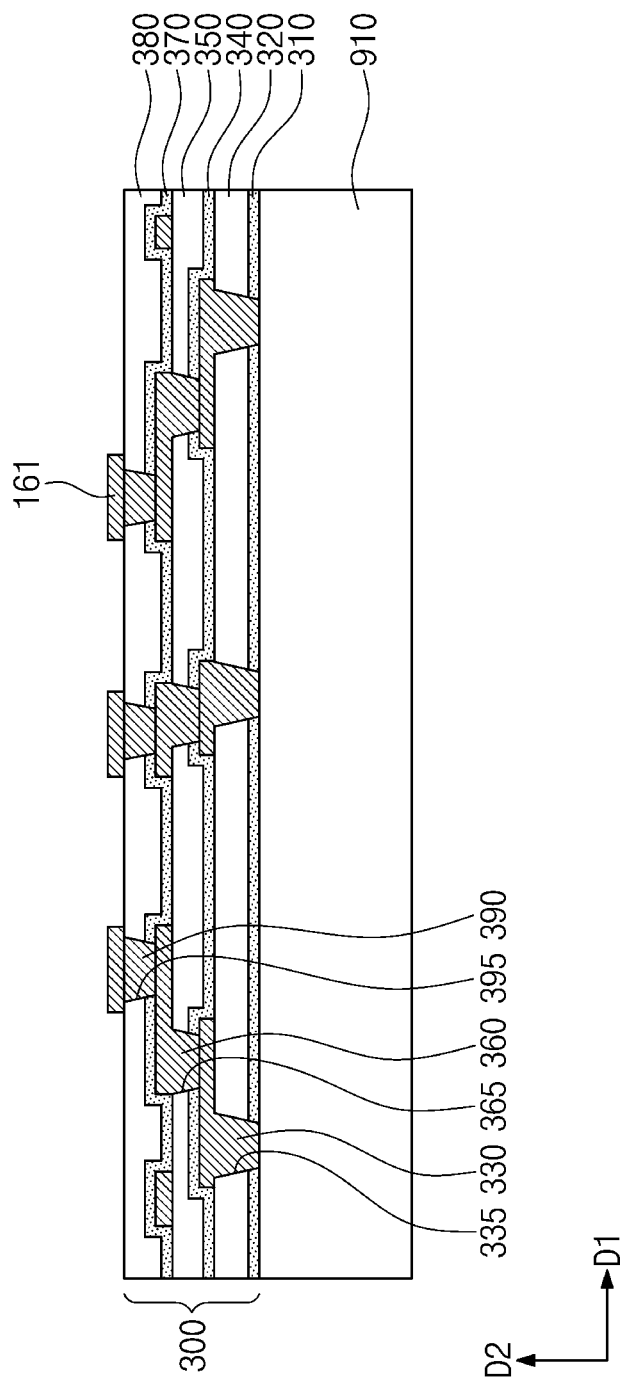

SEMICONDUCTOR PACKAGE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2017-0101832, filed on Aug. 10, 2017, in the Korean Intellectual Property Office, the disclosure of which is hereby incorporated by reference in its entirety.

BACKGROUND

Embodiments of the inventive concepts relate to a semiconductor package and a method of fabricating the same and, more particularly, to a semiconductor package including a redistribution layer and a method of fabricating the same.

Integrated circuit chips are typically provided with a semiconductor package so as to be suitably applied to circuit boards of electronic products or otherwise combined within an electronic system. In a general semiconductor package, an integrated circuit chip (or a semiconductor chip) may be mounted on a printed circuit board (PCB) and may be electrically connected to the PCB through bonding wires or bumps. Various researches for improving reliability and durability of semiconductor packages have been conducted with the development of an electronic industry.

SUMMARY

Embodiments of the inventive concepts may provide a semiconductor package with improved reliability and durability and a method of fabricating the same.

In some examples, a semiconductor package comprises a semiconductor chip comprising an insulative protective layer and a plurality of conductive chip pads exposed through openings in the insulative protective layer; and a redistribution layer including a plurality of insulating layers each comprising an organic film, and a plurality of conductive redistribution patterns, each of the conductive redistribution patterns comprising a conductive interconnection portion formed on a surface of a corresponding one of the insulating layers. The least one organic film of one of the plurality of insulating layers may comprises a filler comprising a plurality of ion trapping particles formed of an inorganic material dispersed in the at least one organic film, the plurality of ion trapping particles comprised of a material that combines with a reactive material corrosive to the chip pads.

For example, an organic film of one of the plurality of insulating layers may comprise a filler comprising a plurality of ion trapping particles formed of an inorganic material which is chemically reactive with at least one of the following ions: Cl−, K+, Na+, OH− and H+.

In some examples, the inorganic material of the filler comprises at least one of a magnesium compound, a magnesium (Mg) compound, an alabamine (Ab) compound and a bismuth (Bi) compound.

In some examples some or all of the plurality of insulating layers may be polymer films, and may be applied by a coating process, such as by spraying, in a wafer level or panel level packing process that forms several redistribution layers together at the same time to connect to a corresponding semiconductor chip or chips.

In some examples, a method of manufacturing a semiconductor package and/or a system, such as a module having several packages mounted to a board, comprises forming at least one first insulating layer on a first surface of a semiconductor chip, the first surface of the semiconductor chip comprising a plurality of metal chip pads to provide signals and power to the semiconductor chip, the plurality of metal chip pads including a first chip pad; patterning the at least one first insulating layer to expose the chip pads of the semiconductor chip through corresponding openings in the at least one first insulating layer; and forming a first redistribution pattern on the first insulating layer, the first redistribution pattern comprising a first via contacting the first chip pad and a first interconnection portion connected to the first via extending horizontally on the at least one first insulating layer. The at least one first insulating layer may comprise an organic film including a plurality of ion trapping particles dispersed therein, and the ion trapping particles may be formed of an inorganic material.

In some examples, a method of manufacturing comprises forming a first redistribution layer, the first redistribution layer comprising a plurality of redistribution patterns and a plurality of insulating layers, neighboring ones of the plurality of redistribution patterns having one or more of the plurality of insulating layers disposed therebetween. The first redistribution layer may be connected to a first semiconductor chip at a first surface of the first redistribution layer. The redistribution patterns of the first redistribution layer may be connected to form a plurality of discrete wirings, at least some of which electrically connect chip pads of the first semiconductor chip to corresponding terminal pads of the first redistribution layer at a second surface of the first redistribution layer. The at least one of the plurality of insulating layers may comprise a first organic film having a plurality of ion trapping particles dispersed therein. The ion trapping particles may be formed of an inorganic material.

BRIEF DESCRIPTION OF THE DRAWINGS

The inventive concepts will become more apparent in view of the attached drawings and accompanying detailed description.

FIGS. 1, 2A, 3A, 4A, 5A, and 6A are cross-sectional views illustrating a method of fabricating a semiconductor package, according to some embodiments of the inventive concepts.

FIG. 4B is an enlarged view of a region 'A' of FIG. 4A.

FIGS. 7A and 7B are cross-sectional views illustrating processes of fabricating a semiconductor package, according to some embodiments of the inventive concepts.

FIGS. 11A to 11C are cross-sectional views illustrating a method of fabricating a semiconductor package, according to some embodiments of the inventive concepts.

DETAILED DESCRIPTION OF THE EMBODIMENTS

Figure 2A:
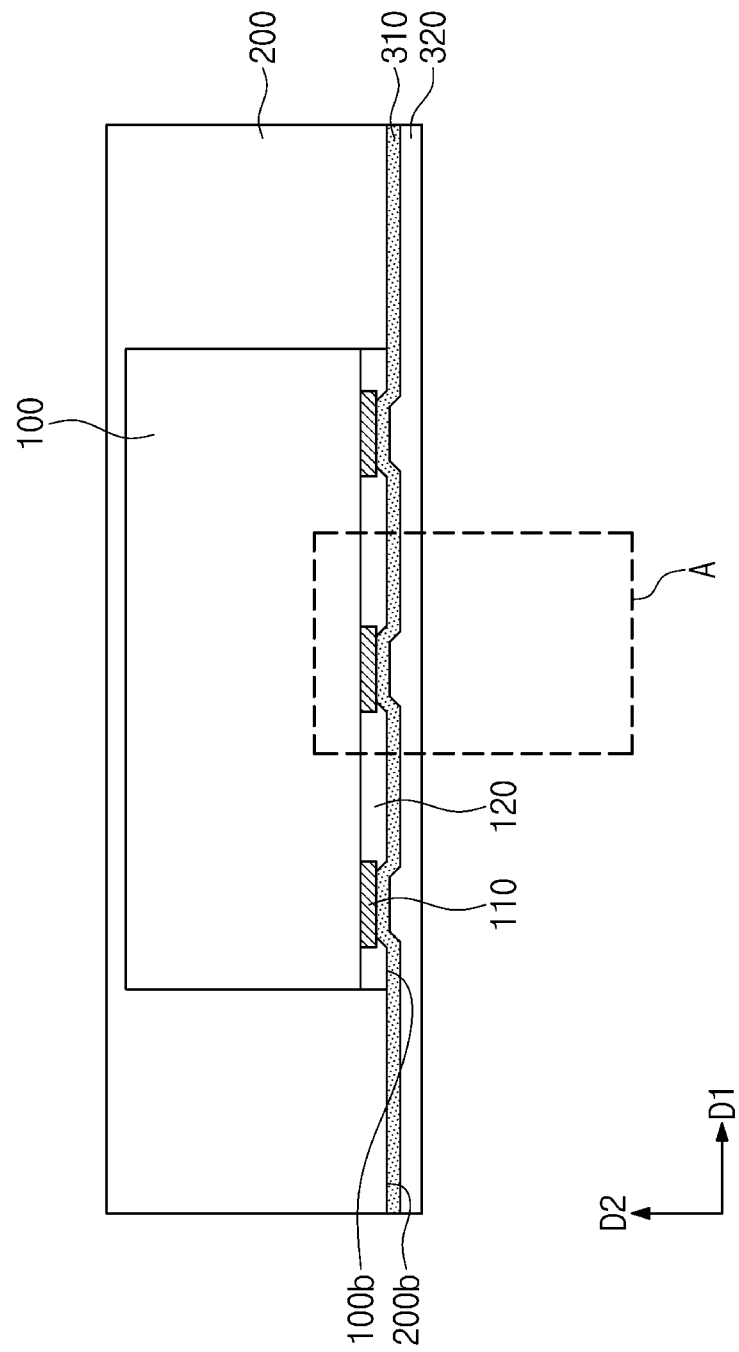

Semiconductor packages and methods of fabricating the same according to embodiments of the inventive concepts will be described hereinafter.

FIGS. 1, 2A, 3A, 4A, 5A, and 6A are cross-sectional views illustrating a method of fabricating a semiconductor package, according to some embodiments of the inventive concepts. FIGS. 2B, 4B, 5B, and 6B are enlarged views of regions 'A' of FIGS. 2A, 4A, 5A, and 6A, respectively. FIG. 4B is an enlarged view of a region 'A' of FIG. 4A. FIG. 4C is an enlarged view corresponding to the region 'A' of FIG. 4A to illustrate a first redistribution pattern according to some embodiments of the inventive concepts. FIGS. 4D and 4E are enlarged views corresponding to the region 'A' of FIG. 4A to illustrate a process of forming a first redistribution pattern, according to some embodiments of the inventive concepts.

Referring to FIG. 1, a semiconductor chip 100 and a molding layer 200 may be disposed on a carrier substrate 910. The semiconductor chip 100 may have a top surface 100a and a bottom surface 100b opposite to the top surface 100a. In the examples disclosed herein, a first direction D1 is a direction parallel to the top surface 100a of the semiconductor chip 100 (also corresponding to "horizontal direction" and with respect to "left" and "right"), and a second direction D2 is a direction substantially perpendicular to the top surface 100a of the semiconductor chip 100 (also corresponding to a "vertical direction" and with respect to "above" and "below"). The bottom surface 100b of the semiconductor chip 100 may face the carrier substrate 910. The semiconductor chip 100 may have chip pads 110 disposed on its bottom surface 100b. The chip pad 110 may include a metal such as aluminum, copper, silver, gold, and may be formed of an alloy of one or more of these metals. Each chip pad 110 may form a terminal of the semiconductor chip 100 and be electrically connected to an integrated circuit (not shown) of the semiconductor chip 100 to provide signals and/or power to the integrated circuit of semiconductor chip 100. In the present specification, it will be understood that when an element is referred to as being "electrically connected" to another element, it may be connected directly to the other element or intervening elements may be present to allow transfer of power and/or signals between the elements. The integrated circuit of the semiconductor chip 100 may include transistors. The semiconductor chip 100 may include a protective layer 120, and the protective layer 120 may include a plurality of openings that each expose a respective one of the chip pads 110. The protective layer 120 may be formed during manufacturing of the semiconductor chip 100 and deposited on a semiconductor wafer comprising a plurality of integrated semiconductor devices that are later separated (singulated) into separate semiconductor chips, such as semiconductor chip 100. The protective layer 120 may be an insulating passivation layer (e.g., an insulative inorganic compound, such as SiO2) and applied as the last layer or one of the last layers to such a semiconductor wafer in forming the semiconductor chip. Initially, the protective layer 120 may extend over the chip pads 110. The openings in the protective layer 120 exposing the chip pads 110 may be formed after the semiconductor chip 100 is singulated from the semiconductor wafer. Even though not shown in the drawings, the protective layer 120 may include a plurality of stacked layers.

The molding layer 200 may be formed on the carrier substrate 910 to cover at least a portion of the semiconductor chip 100. In some embodiments, the molding layer 200 may cover the top surface 100a and a sidewall of the semiconductor chip 100, as shown in FIG. 1. In other examples, the molding layer 200 may cover the sidewall of the semiconductor chip 100 and expose the top surface 100a (the molding layer 200 may not be formed on the top surface 100a to expose the top surface 100a with respect to the molding layer 200, but other materials may be formed on the top surface 100a). The molding layer 200 may include, for example, an epoxy molding compound (EMC) which may include resin. Even though not shown in the drawings, an adhesive layer may further be disposed between the carrier substrate 910 and the semiconductor chip 100 and between the carrier substrate 910 and the molding layer 200. Thereafter, the carrier substrate 910 (and the adhesive layer in some examples) may be removed to expose the bottom surface 100b of the semiconductor chip 100 and a bottom surface 200b of the molding layer 200.

Figure 2B:
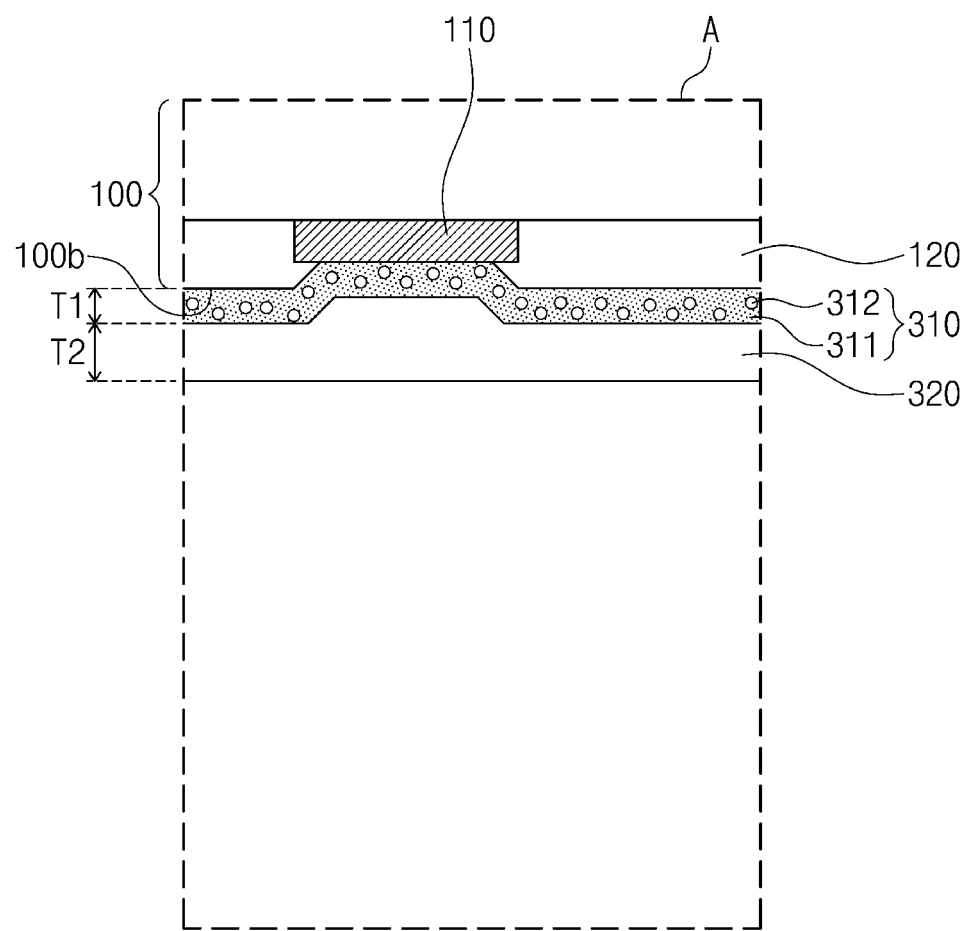
FIG. 2B is an enlarged view of a region 'A' of FIG. 2A.

Referring to FIGS. 2A and 2B, a first upper insulating layer 310 may be formed on the semiconductor chip 100. The first upper insulating layer 310 may be formed by a deposition process or a coating process. The coating process may be spin coating, spray coating, slit coating, roller coating, dip coating or extrusion coating, e.g., and deposit the material of the first upper insulating layer 310 with a nozzle. In some examples, the material of the first upper insulating layer 310 may be applied (e.g., by a nozzle) as a viscous fluid directly onto the surface of the bottom surface 100b of the semiconductor chip 100 and the bottom surface 200b of the molding layer 200, while in other examples, the material of the first upper insulating layer 310 may be applied (e.g., by a nozzle) as a viscous fluid onto the surface of a carrier substrate (e.g., 910 as described herein). For example, the material of the first upper insulating layer 310 may be deposited by a nozzle in the center of a horizontally positioned surface on which the first upper insulating layer 310 is being formed, which is then spun about a vertical axis in a spread step to allow the material of the first upper insulating layer 310 to spread to the edges of the surface on which it is being formed. Spray coating process may spray the material of the first upper insulating layer 310 onto the surface on which first upper insulating layer 310 is being formed and not require any further mechanical processing to position the material into a desired position. Spray coating may include spraying the surface on which the first upper insulating layer 310 is being formed several times (i.e., to spray several coats of the material). Roller coating may comprise rolling a roller across the surface on which first upper insulating layer 310 is being formed to roll the material of the first upper insulating layer 310 into its position on such a surface with a desired thickness. Dip coating may comprise immersing the surface on which the first upper insulating layer 310 is being formed in a container containing the material of the first upper insulating layer 310 and withdrawing the surface at a particular rate to obtain a desired thickness of the first upper insulating layer 310. After such coating processes, the applied material may be baked to substantially remove the ability of the material to flow (which may include, for example, to substantially remove fluid properties of the applied material). Baking may cause removal of solvent of the applied material by evaporation. Forming the first upper insulating layer 310 (including any baking step) may be performed at a temperature less than 300 degrees C., such as between 150 and 300 degrees C.(Celsius) (i.e., in some examples, no step of forming the first upper insulating layer 310 (and in some examples, of forming the entire redistribution layer (RDL layer) 300) may include any step performed with an ambient temperature higher than 300 degrees C.). The first upper insulating layer 310 may cover and contact the bottom surface 100b of the semiconductor chip 100 and the bottom surface 200b of the molding layer 200 (e.g., cover and contact the entire exposed bottom surface of the structure of FIG. 1 after removal of the carrier substrate and adhesive if applicable). The first upper insulating layer 310 may be provided on and in contact with the protective layer 120 and the chip pads 110 of the semiconductor chip 100. As illustrated in FIG. 2B, the first upper insulating layer 310 may be composed of a first polymer 311 and a first inorganic filler 312.

In some embodiments, the first polymer 311 may form an organic film, such as a photosensitive polymer film. For example, the photosensitive polymer film may include at least one of photosensitive polyimide (PSPI), polybenzoxazole (PBO), a phenolic polymer, or a benzocyclobutene-based polymer (BCB). The photosensitive polymer film may be electrically insulating and be formed as a passivation layer. Alternatively, the first polymer 311 may form an organic film as a non-photosensitive polymer film. The non-photosensitive polymer film may include or be an epoxy-based polymer. The first inorganic filler 312 may be formed as a plurality of particles, and these particles of the first inorganic filler 312 may be dispersed in the first polymer 311. For example, the first inorganic filler 312 may include an ion trapping agent. The ion trapping agent may include at least one of a magnesium (Mg) compound, an alabamine (Ab) compound, or a bismuth (Bi) compound. The ion trapping agent may capture a reactive material such as a chlorine ion. The reactive material may be a corrosive material to conductive wiring (e.g., metal conductors) of the semiconductor package 1 and/or semiconductor chip 100. For example, the reactive material may be a by-product of a process of manufacturing the semiconductor package 1 and may undesirably chemically react with and corrode conductive wiring within the semiconductor package (e.g., pads 110 of the semiconductor chip 100) if the reactive material were to come into contact with such conductive wiring. For example, the reactive material may chemically react with (and thus corrode) aluminum, copper and silver at room temperature. In some examples, the reactive material may be a negatively charged chlorine ion (a chlorine anion) but the invention is not limited thereto.

For example, an aluminum wiring (e.g., pad) may react with chlorine and form $AlCl_3$ (e.g., with the following process: $Al(OH)_3 + Cl^- \rightarrow Al(OH)_2Cl + OH^- Al + 3Cl^- \rightarrow AlCl_3 + 3e^-$. The reactive material may be any halogen ion (e.g., one or more of fluorine (F), chlorine (Cl), bromine (Br), iodine (I), and/or astatine (At) ions). The reactive material may also be acidic compounds that chemically react with the conductive wiring (e.g., Al, Cu or Ag, such as at room temperature, e.g.).

The ion trapping agent may capture the reactive material by chemically reacting with the reactive material. In some examples, a chemical reaction of the ion trapping agent with the reactive material may be in the form of chemisorption where the reactive material chemically bonds with the ion trapping agent and is adsorbed (adheres) to the surface of the filler particle including the ion trapping agent. In some examples, such a chemical reaction of the ion trapping agent with the reactive material may result in creating one or more new chemical compounds. One or more of such new chemical compounds may remain attached to (bonded) to a particle of the inorganic filler 312 in some examples. In addition, one or more of such new chemical compounds may become disassociated with the particle of the inorganic filler 312 that chemically reacted with the reactive material, where such new disassociated chemical compound(s) are not reactive (e.g., not being reactive to the conductive wiring of the semiconductor chip 100 and/or semiconductor package 1 at room temperature or at an operating temperature of the semiconductor chip 100, e.g., not being reactive to any of Al, Ag and Cu at room temperature or at an operating temperature of the semiconductor chip 100). Room temperature may be 21 degrees C. The ion trapping agent may be an ion exchanger compound, such as a halogen ion exchanger that exchanges an ion of the ion trapping agent compound with a halogen ion. The trapping agent may be reactive with a halogen ion (e.g., $Cl^-$) to form an ionic bond with the halogen ion and provide a resultant byproduct including a different, non-reactive ion. The exchanged ions may be anions. For example, the ion trapping agent may exchange the reactive halogen ion for a non-reactive ion at the same (e.g., ionic) bond location of the remaining portion of the compound forming the ion trapping agent. In some examples, the ion trapping agent may be a hydrotalcite-like compound (HTlc). Hydrotalcite-like compounds (HT) can be represented by the following formula: $[Mg_{1-x}Al_x(OH)_2]^{x+}[A_{x/n}^{n-} \cdot mH_2O]^{x-}$, wherein $0 < x < 0.33$ (e.g.) and $A^{n-}$ is an exchangeable anion having a valence of n. As another example, the first inorganic filler 312 may include particles that trap the reactive material by physisorption to adsorb the reactive material to the surface of the particles of the first inorganic filler without a chemical reaction. The first inorganic filler 312 may be formed of 100% of the trapping particles described herein. However, the first inorganic filler 312 may be formed of a combination of trapping particles another material, such as inorganic materials such as silicon oxide ($SiO_2$) particles and aluminum oxide ($Al_2O_3$) particles. The size of the trapping particles of the first inorganic filler 312 may be as little as about 1 nm. In some examples, the size of the trapping particles may be formed as large as about 5 um. The size of the trapping particles may be no larger than 20% of the thickness of the first polymer 311. A first lower insulating layer 320 may be formed on and in contact with the first upper insulating layer 310. The first lower insulating layer 320 may be formed by a deposition process or a coating process such as described herein. The first lower insulating layer 320 may be a photosensitive polymer film. For example, the photosensitive polymer film may include at least one of photosensitive polyimide (PSPI), polybenzoxazole (PBO), a phenolic polymer, or a benzocyclobutene-based polymer (BCB). The first lower insulating layer 320 may be formed of the same photosensitive polymer material as the first polymer 311. However, embodiments of the inventive concepts are not limited thereto. Photosensitive polymer materials described herein may comprise polymers that are themselves sensitive to light to alter the chemical composition of such polymers, and/or may comprise a photoinitiators that are sensitive to light to alter the chemical composition of the photoinitiators which then react with one or more polymer(s) of the photosensitive polymer materials to alter the chemical composition of the polymer(s) therein. For example, a photoinitator may be a photoacid generator (PAG) and the photosensitive polymer films herein may comprise a mixture of one or more polymers and PAG. It will be apparent that in both of these examples, the polymer(s) of the photosensitive polymer material may have its (their) chemical composition altered when the photosensitive polymer material is exposed to a light source. The first lower insulating layer 320 may not include an ion trapping agent such as an inorganic filler that may chemically react with a reactive material such as a chlorine ion (e.g., the first lower insulating layer 320 may not include any inorganic particles of a magnesium (Mg) compound, an alabamine (Ab) compound, a bismuth (Bi) compound). A thickness T2 of the first lower insulating layer 320 may be greater than a thickness T1 of the first upper insulating layer 310. For example, the thickness T1 of the first upper insulating layer 310 may range from 10% to 70% of the thickness T2 of the first lower insulating layer 320. A conductive element or component (e.g., a redistribution pattern or a conductive pattern) may not be disposed between the first lower insulating layer 320 and the first upper insulating layer 310. The first upper insulating layer 310 may be formed directly on the first lower insulating layer 320 and thus be in contact and have no intervening materials at such locations. As will be appreciated, the process of forming the first upper insulating layer 310 and the first lower insulating layer 320 may comprise first forming the first upper insulating layer 310 and then forming the first lower insulating layer 320 on (e.g., directly on) the first upper insulating layer 310. In such a process, it may be considered that the first upper insulating layer 310 is a lower layer and the first lower insulating layer 320 is an upper layer. For ease of description, the terminology of "upper" and "lower" used herein (for layers 310, 320, and for other layers), generally conforms with their depiction in the Figures, however, it should be appreciated that the terminology of "upper" and "lower" (and similarly "above," "below," "left," "right," etc.") is generally chosen to describe the position of elements of the preferred embodiments relative to each other, rather than to denote a position that would depend on the orientation of a device in the real world. It should also be appreciated that use of ordinal numbers "first," "second," etc., do not indicate an order or location, unless context indicates otherwise, but merely are used to distinguish like elements from one another. Thus, e.g., reference to a "second" element in the disclosure may correspond to a "first" element referenced elsewhere (e.g., the claims) and vice versa.

Referring to FIG. 3A, a first opening 335 may be formed in the first upper insulating layer 310 and the first lower insulating layer 320. The first opening 335 may penetrate the first upper insulating layer 310 and the first lower insulating layer 320. The first opening 335 may expose the chip pad 110. The process of forming the first opening 335 will be described hereinafter in more detail.

Figure 3B:
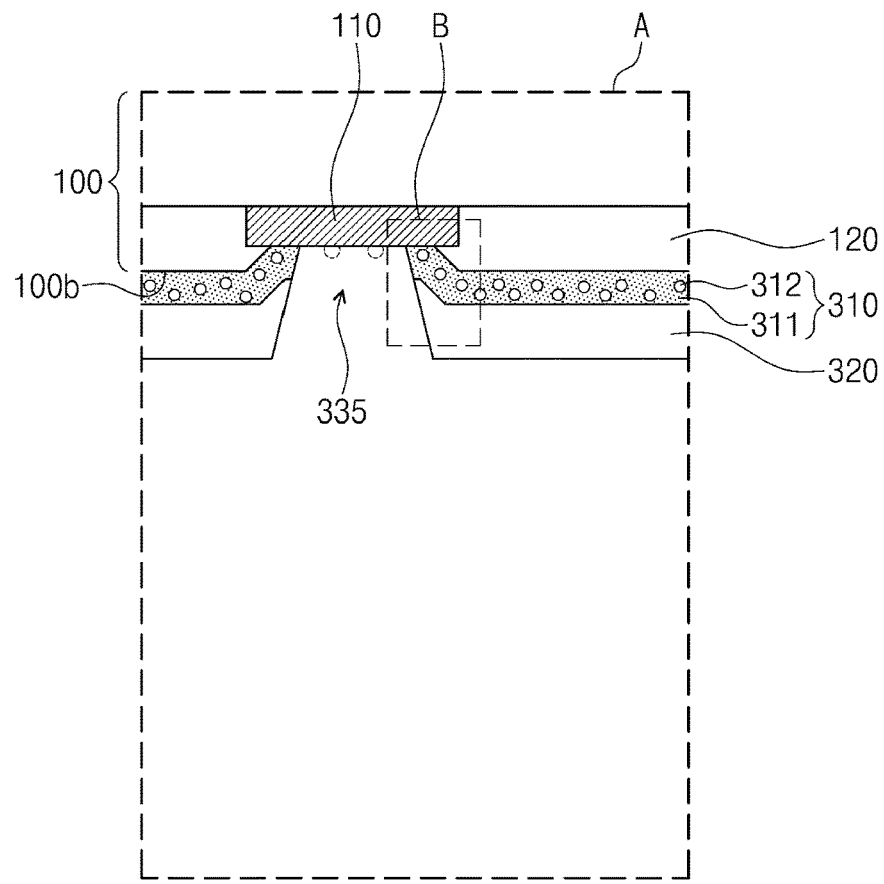
FIG. 3B is an enlarged view corresponding to a region 'A' of FIG. 3A to illustrate a process of forming a first opening, according to some embodiments of the inventive concepts.
Figure 3C:
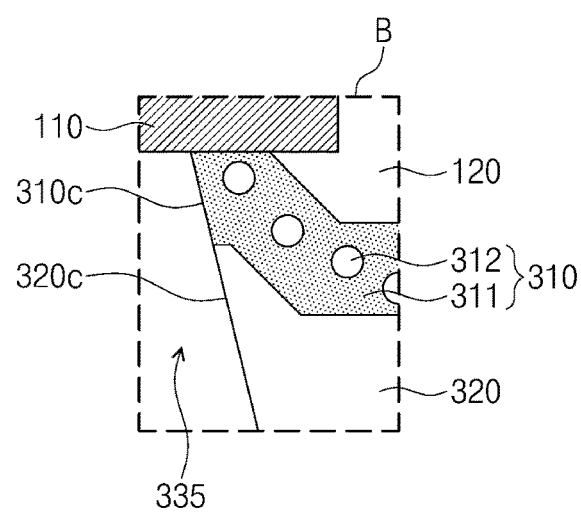
FIG. 3C is an enlarged view of a region 'B' of FIG. 3B.

FIG. 3B is an enlarged view corresponding to a region 'A' of FIG. 3A to illustrate a method of fabricating a semiconductor package, according to some embodiments of the inventive concepts. FIG. 3C is an enlarged view of a region 'B' of FIG. 3B.

Referring to FIGS. 3A, 3B, and 3C, the first lower insulating layer 320 and the first upper insulating layer 310 may be patterned. The first polymer 311 of the first upper insulating layer 310 may include the photosensitive polymer film. The process of patterning the first lower insulating layer 320 and the first upper insulating layer 310 may be performed by an exposure process and a development process. The exposure process may be a conventional photolithographic exposure process and comprise selectively exposing (e.g., using a photolithographic mask) portions of the first lower insulating layer 320 and first upper insulating layer 310 to light (e.g., extreme ultraviolet light) causing a chemical change in the photosensitive polymer film(s) of the first lower insulating layer 320 and/or first upper insulating layer 310 (which may be a result of a photoacid generator in the photosensitive polymer film(s)). The development process may comprise removing the light exposed portion of the first lower insulating layer 320 and/or first upper insulating layer 310 with a positive tone developer to selectively remove the light exposed portions (or in the alternative, with a negative tone developer to remove the portions not exposed by light) from the first lower insulating layer 320 and/or first upper insulating layer 310 and pattern the same. The first polymer 311 of the first upper insulating layer 310 and first lower insulating layer 320 may be formed of the same photosensitive polymer material. Thus, the first upper insulating layer 310 and the first lower insulating layer 320 may be patterned by a single process (e.g., removal by the same developer or same etchant performed in the same process chamber without removing the device from the chamber and/or subjecting the chamber to a vacuum break). The first inorganic filler 312 may reflect or scatter light. The first lower insulating layer 320 may not include the inorganic filler. Thus, a transmittance of the first lower insulating layer 320 may be greater than a transmittance of the first upper insulating layer 310. In some embodiments, after the formation of the first upper insulating layer 310, the first lower insulating layer 320 may be formed on the first upper insulating layer 310. Thus, the first lower insulating layer 320 may be well exposed by the exposure process.

If the thickness T1 of the first upper insulating layer 310 is greater than 70% of the thickness T2 of the first lower insulating layer 320, the patterning of the first upper insulating layer 310 and the first lower insulating layer 320 may be less precise than might be desired to expose the chip pad 110, especially when the desired dimensions of the opening 335 are small. However, according to some embodiments of the inventive concepts, the thickness T1 of the first upper insulating layer 310 may be equal to or less than 70% of the thickness T2 of the first lower insulating layer 320, and thus the first opening 335 may be easily formed. The thickness T1 of the first upper insulating layer 310 and the thickness T2 of the first lower insulating layer 320 may be made small, such as less than 20 um.

As illustrated in FIG. 3C, a sidewall 310c of the first upper insulating layer 310 in the first opening 335 may be relatively smooth. For example, a surface roughness of the sidewall 310c of the first upper insulating layer 310 may be equal or similar to a surface roughness of a sidewall 320c of the first lower insulating layer 320 in the first opening 335. After the development process, a residue of the first lower insulating layer 320 and/or a residue of the first upper insulating layer 310 may remain in the first opening 335, as represented by dotted lines on the surface of pad 110 in FIG. 3B. A process of removing the residue of the first lower insulating layer 320 and/or the residue of the first upper insulating layer 310 may further be performed.

Figure 3D:
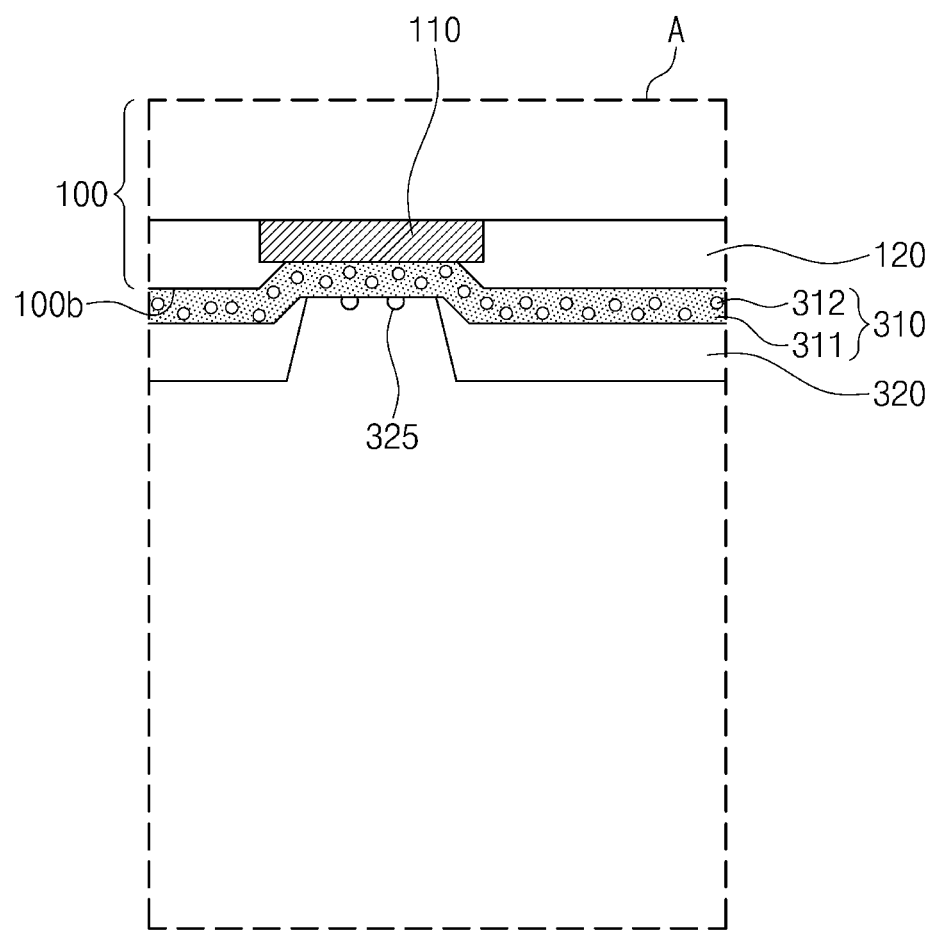
FIGS. 3D and 3E are enlarged views corresponding to the region 'A' of FIG. 3A to illustrate a process of forming a first opening, according to some embodiments of the inventive concepts.
Figure 3E:
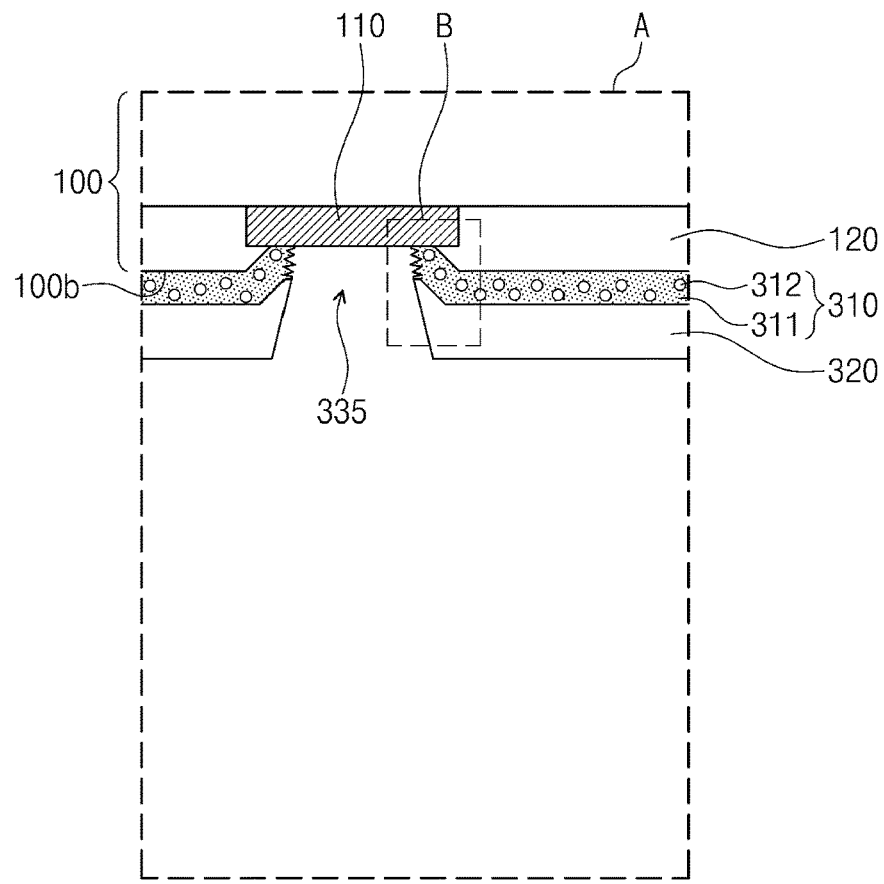
Figure 3F:
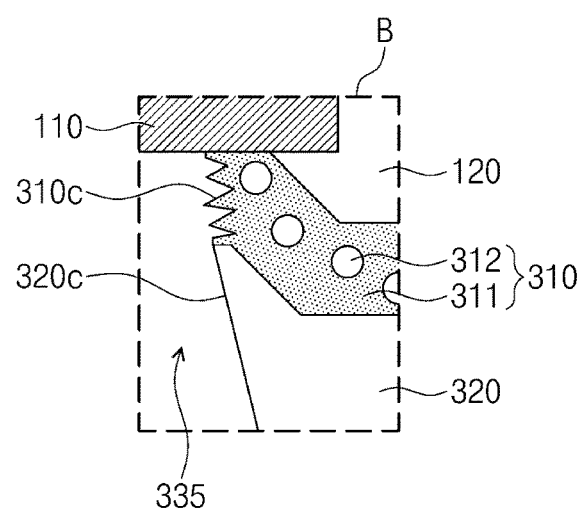
FIG. 3F is an enlarged view of a region 'B' of FIG. 3E.

FIGS. 3D and 3E are enlarged views corresponding to the region 'A' of FIG. 3A to illustrate a process of forming a first opening, according to some embodiments of the inventive concepts. FIG. 3F is an enlarged view of a region 'B' of FIG. 3E.

Referring to FIGS. 3A and 3D, the first lower insulating layer 320 may be patterned to expose the first upper insulating layer 310. The process of patterning the first lower insulating layer 320 may be performed by exposure (e.g., photolithographic exposure process as described herein) and development processes (e.g., using a positive tone developer or a negative tone developer after selectively exposing the first lower insulating layer 320 via photolithography, as described herein). In this case, the first polymer 311 may comprise a non-photosensitive polymer film and may not comprise any photosensitive polymer material (or other material whose chemical composition or material properties are altered upon exposure to light). The first lower insulating layer 320 may expose portions of the first upper insulating layer 310 after the process of patterning the first lower insulating layer 320. A residue 325 of the first lower insulating layer 320 may remain on the exposed surface of the first upper insulating layer 310.

Referring to FIGS. 3A, 3E, and 3F, an etching process may be performed on the first upper insulating layer 310 to remove the residue 325 of the first lower insulating layer 320. The etching process may be a plasma etching process using a fluorine-containing gas (e.g., $CF_4$) or an argon gas. The first lower insulating layer 320 may have an etch selectivity with respect to the first upper insulating layer 310. Portions of the first upper insulating layer 310 that are exposed by the first lower insulating layer 320 may be removed by the etching process. The etching process may be performed until the chip pad 110 is exposed. Thus, the first opening 335 may be formed. The thickness T1 of the first upper insulating layer 310 may be equal to or less than 70% of the thickness T2 of the first lower insulating layer 320, and thus the first opening 335 may be easily formed even if relatively small. Since the first upper insulating layer 310 is etched when the residue 325 of the first lower insulating layer 320 is removed, a separate process of patterning the first upper insulating layer 310 can be omitted. Thus, processes of fabricating the semiconductor package may be simplified. Since the first lower insulating layer 320 is formed on the first upper insulating layer 310, the removal of the residue 325 of the first lower insulating layer 320 and the etching of the first upper insulating layer 310 may be performed by a single process (e.g., an etching process performed in the same process chamber without removing the device from the chamber and/or subjecting the chamber to a vacuum break).

As illustrated in FIG. 3F, a sidewall 310c of the first upper insulating layer 310 and a sidewall 320c of the first lower insulating layer 320 may be exposed by the first opening 335. Since the first upper insulating layer 310 is patterned by the process (i.e., the etching process) different from the process of patterning the first lower insulating layer 320, a surface roughness of the sidewall 310c of the first upper insulating layer 310 may be different from a surface roughness of the sidewall 320c of the first lower insulating layer 320. For example, since the first upper insulating layer 310 is patterned by the etching process, the sidewall 310c of the first upper insulating layer 310 may be relatively rough. The surface roughness of the sidewall 310c of the first upper insulating layer 310 may be greater than the surface roughness of the sidewall 320c of the first lower insulating layer 320.

Figure 4A:
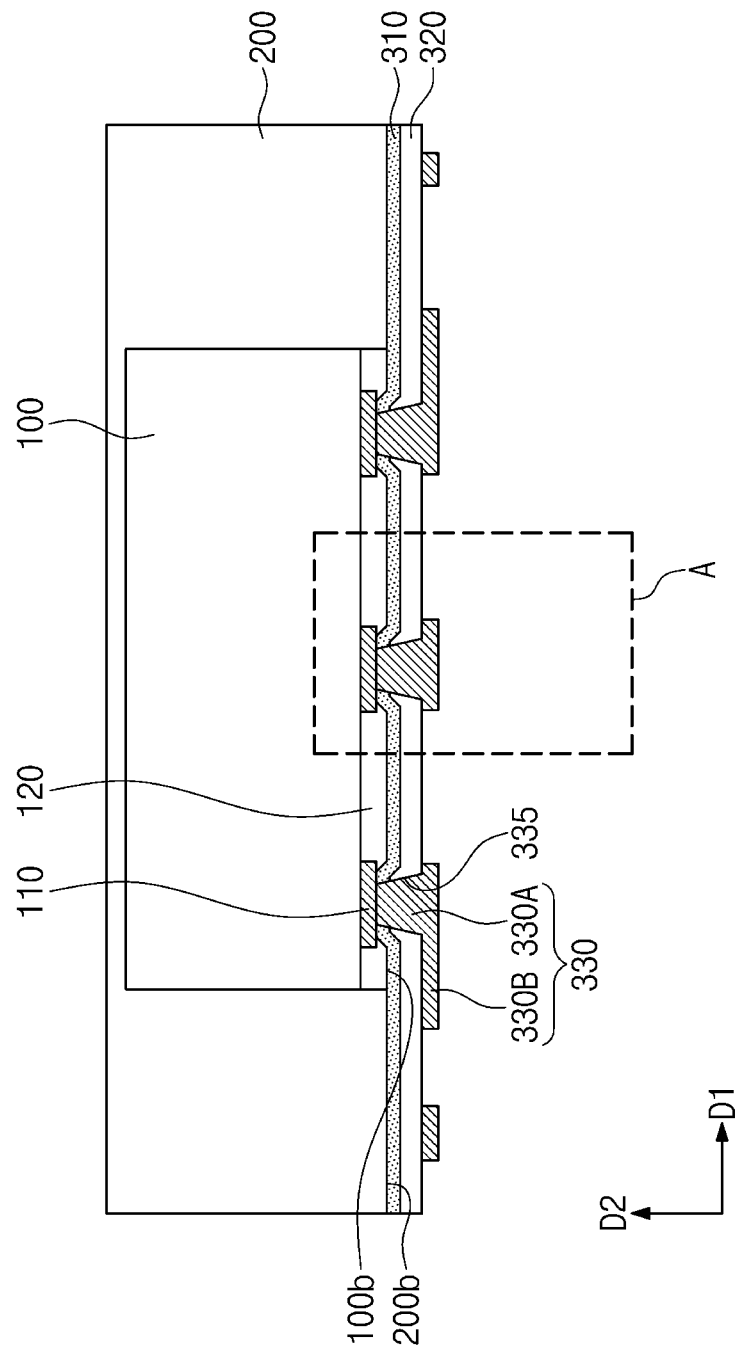
Figure 4C:
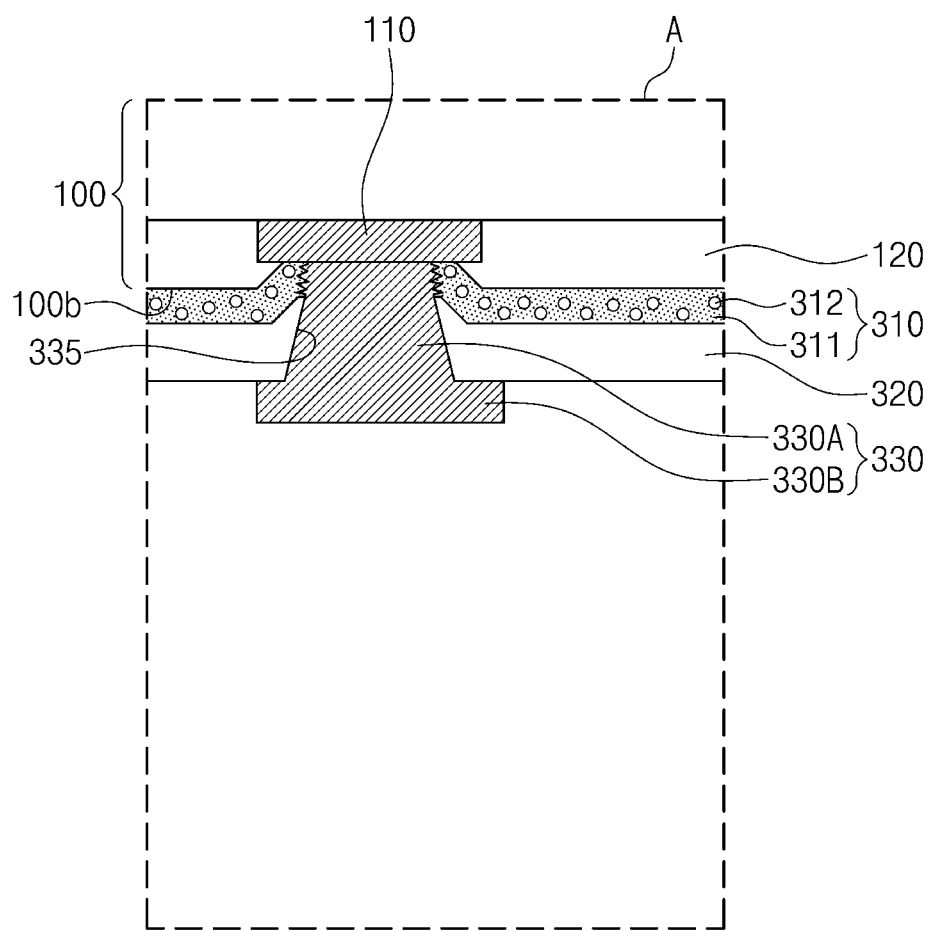
FIG. 4C is an enlarged view corresponding to the region 'A' of FIG. 4A to illustrate a first redistribution pattern according to some embodiments of the inventive concepts.
Figure 4D:
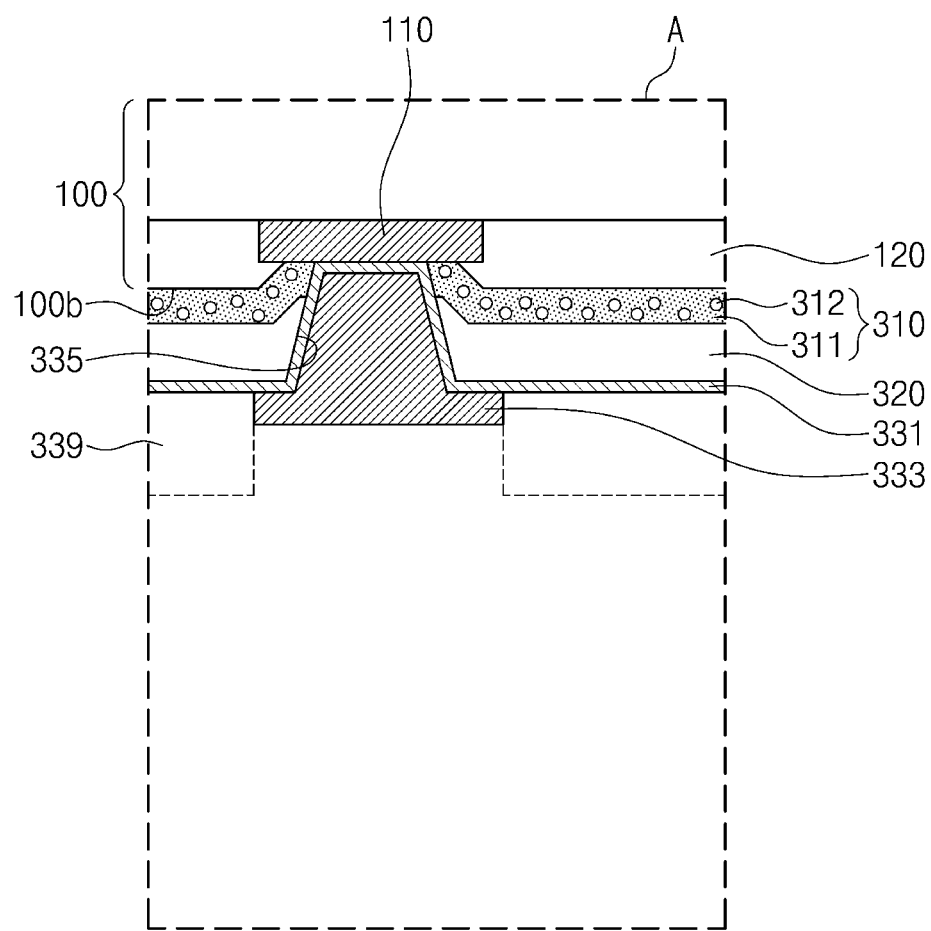
FIGS. 4D and 4E are enlarged views corresponding to the region 'A' of FIG. 4A to illustrate a process of forming a first redistribution pattern, according to some embodiments of the inventive concepts.
Figure 4E:
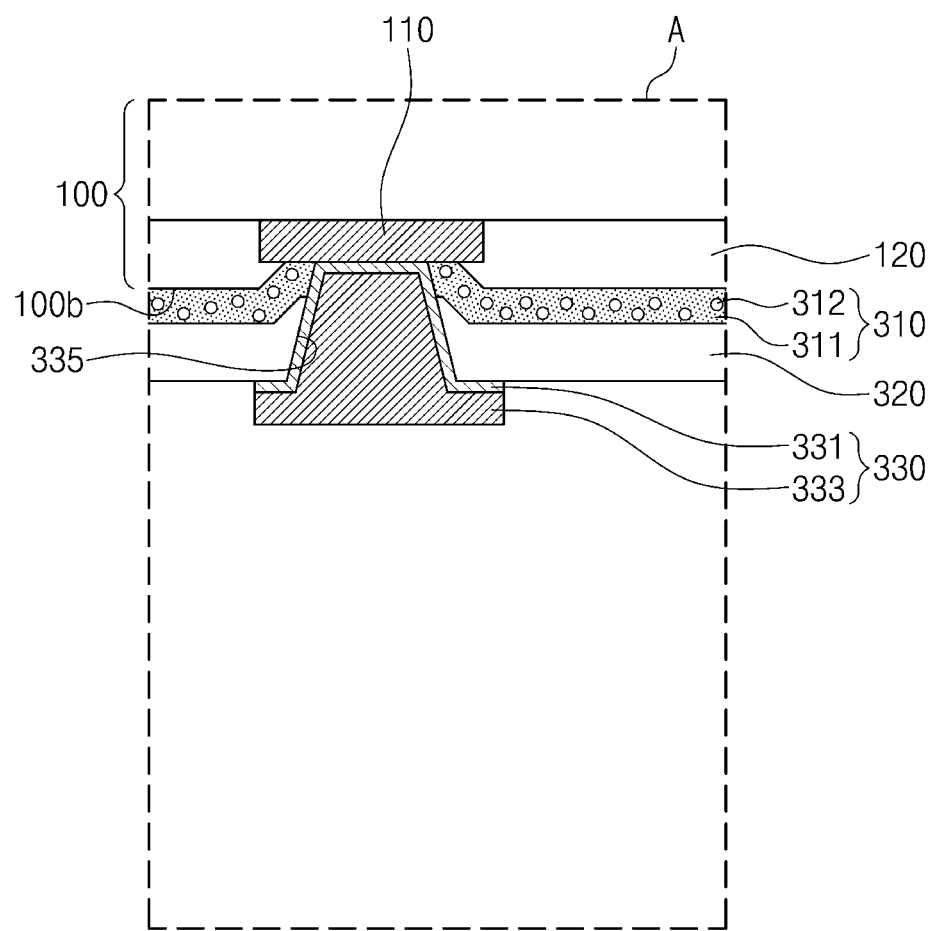

Referring to FIGS. 4A, 4B, and 4C, a first redistribution pattern 330 may be formed as a patterned conductive layer on the first lower insulating layer 320 and in the first opening 335. The first redistribution pattern 330 may penetrate the first upper insulating layer 310 and the first lower insulating layer 320. The first redistribution pattern 330 may be connected to the chip pad 110 to provide a conductive path between the chip pad 110 and a terminal (e.g., solder bump) of the semiconductor package. For example, the first redistribution pattern 330 may contact the chip pad 110 (i.e., directly connected to the chip pad 110). The first redistribution pattern 330 may include a via portion 330A to provide an electrical connection in the vertical direction and an interconnection portion 330B running horizontally on first lower insulating layer 320 to provide an electrical connection therebetween. The via portion 330A of the first redistribution pattern 330 may be provided in the first opening 335. The interconnection portion 330B of the first redistribution pattern 330 may be disposed on the first lower insulating layer 320. The interconnection portion 330B of the first redistribution pattern 330 may be formed integrally with the via portion 330A and be homogenously formed of the same conductive material(s). In some embodiments, as illustrated in FIG. 4B, the first redistribution pattern 330 may be disposed in the first opening 335 formed in the embodiment described with reference to FIGS. 3B and 3C. In other embodiments, as illustrated in FIG. 4C, the first redistribution pattern 330 may be disposed in the first opening 335 formed in the embodiment described with reference to FIGS. 3D to 3F. In this case, the sidewall 310c (see FIG. 3F) of the first upper insulating layer 310 may be rough, and the first redistribution pattern 330 may cover the sidewall 310c of the first upper insulating layer 310. Hereinafter, the first opening 335 of FIGS. 3B and 3C will be illustrated in the following drawings for the purpose of ease and convenience in explanation and illustration, however, it will be understood that the first opening 335 of FIGS. 3E and 3F (and related process of forming the same) is equally applicable to the following description and drawings. The formation of the first redistribution pattern will be described hereinafter in more detail.

FIGS. 4D and 4E are enlarged views corresponding to the region 'A' of FIG. 4A to illustrate a process of forming a first redistribution pattern, according to some embodiments of the inventive concepts.

Referring to FIG. 4D, a seed pattern 331 may be conformally formed on the first lower insulating layer 320 and in the first opening 335. The seed pattern 331 may be disposed on the sidewalls of the first lower insulating layer 320 and the first upper insulating layer 310 exposed by the first opening 335 and may cover the chip pad 110 exposed by the first opening 335. A mask pattern 339 may be formed on the seed pattern 331. The mask pattern 339 may expose a portion of the seed pattern 331. An electroplating process using the seed pattern 331 as an electrode may be performed to form a conductive pattern 333. The conductive pattern 333 may be selectively formed on the seed pattern 331 exposed by the mask pattern 339. The conductive pattern 333 may be a conductive metal such as copper. Thereafter, the mask pattern 339 may be removed to expose a portion of the seed pattern 331 previously covered by the mask pattern 339.

Referring to FIG. 4E, the exposed seed pattern 331 may be removed by an etching process to form the first redistribution pattern 330. A portion of the first lower insulating layer 320 may be exposed after the etching process. The conductive pattern 333 may have an etch selectivity with respect to the seed pattern 331 such that the etch rate of the conductive pattern 333 is less than that of the seed pattern 331. The first redistribution pattern 330 may include the seed pattern 331 and the conductive pattern 333. The seed pattern 331 and the conductive pattern 333 are not illustrated separately in other drawings except FIGS. 4D and 4E and are instead represented together as the first redistribution pattern for the purpose of ease and convenience in illustration, however, it will be understood that the first redistribution pattern 330 described and shown elsewhere may be similarly formed as described and shown with respect to FIGS. 4D and 4E. Further, other redistribution patterns described herein may also be formed as patterned conductive layers and have the same structure and materials as described with respect to the first redistribution pattern 330 and may be formed in according to the same process as described with respect to the first redistribution pattern 330.

Figure 5A:
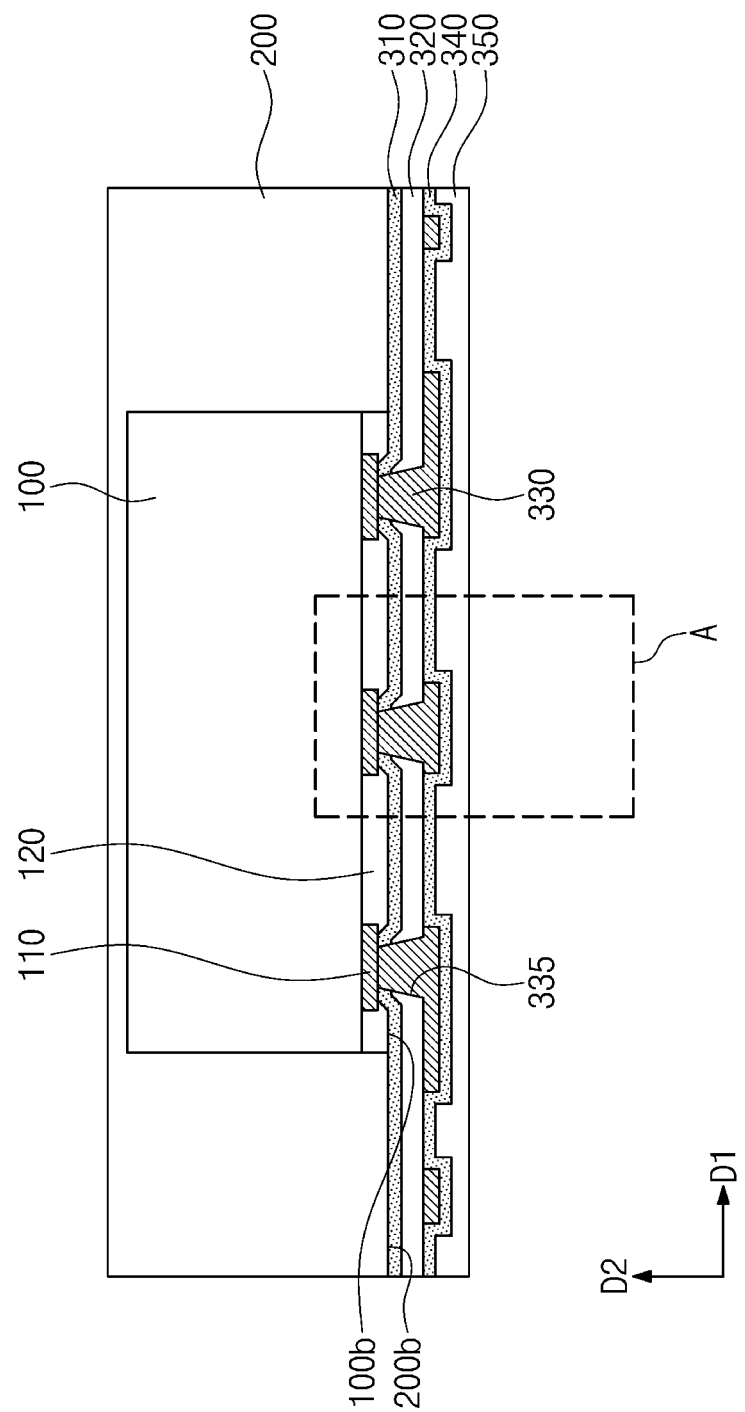
Figure 5B:
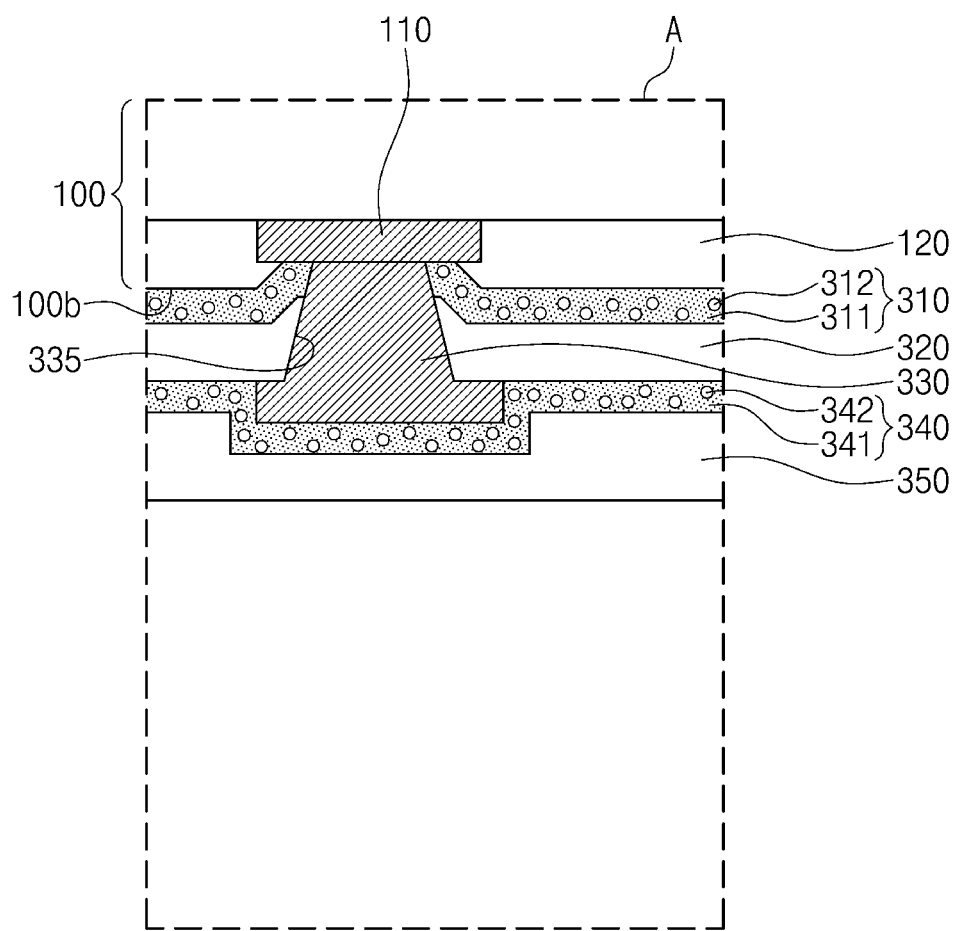
FIGS. 5B and 6B are enlarged views of regions 'A' of FIGS. 5A and 6A, respectively.

Referring to FIGS. 5A and 5B, a second upper insulating layer 340 and a second lower insulating layer 350 may be sequentially formed on the first lower insulating layer 320. The second upper insulating layer 340 may cover the first lower insulating layer 320 and the first redistribution pattern 330. The second upper insulating layer 340 may include a second polymer 341 and a second inorganic filler 342. The second inorganic filler 342 may comprise a plurality of filler particles, and the particles of the second inorganic filler 342 may be dispersed in the second polymer 341. The second upper insulating layer 340 may be formed in the same manner and contain the same materials as described herein with respect to the first upper insulating layer 310 (although they may be the same in the same device, they need not be the same in the same device). The second polymer 341 may be formed with the material(s) described with respect to the examples of the first polymer 311 of FIGS. 2A and 2B. For example, the second polymer 341 may be a photosensitive polymer film, such as described herein. As another example, the second polymer 341 may formed as a non-photosensitive polymer film, such as described herein. The second inorganic filler 342 may be formed as described herein with respect to the examples of the first inorganic filler 312. For example, the second inorganic filler 342 may include at least one of a magnesium (Mg) compound, an alabamine (Ab) compound and a bismuth (Bi) compound. The second upper insulating layer 340 may be formed by a deposition process or a coating process, such as described elsewhere herein (e.g., with respect to the first upper insulating layer 310).

The second lower insulating layer 350 may cover and contact the second upper insulating layer 340. The second lower insulating layer 350 may be a photosensitive polymer film, such as those described elsewhere herein. The second lower insulating layer 350 may be a photosensitive polymer film identical to that of the first lower insulating layer 320 and may be formed of the same photosensitive polymer material as the second polymer 341. However, embodiments of the inventive concepts are not limited thereto. The second lower insulating layer 350 may not include an inorganic filler. Thus, a transmittance of the second lower insulating layer 350 may be greater than a transmittance of the second upper insulating layer 340. A thickness of the second lower insulating layer 350 may be greater than a thickness of the second upper insulating layer 340. For example, the thickness of the second upper insulating layer 340 may range from 10% to 70% of the thickness of the second lower insulating layer 350. The thickness of the second lower insulating layer 350 and the thickness of the second upper insulating layer 340 and may be formed with thicknesses described herein with respect to the thickness T1 of the first upper insulating layer 310 and the thickness T2 of the first lower insulating layer 320, respectively. The thickness of the second lower insulating layer 350 and the thickness of the second upper insulating layer 340 and may be formed to have substantially the same thickness of the first upper insulating layer 310 and the thickness T2 of the first lower insulating layer 320, respectively (or these thicknesses may differ). The second lower insulating layer 350 may be formed by a deposition process or a coating process such as described elsewhere herein.

Figure 6B:
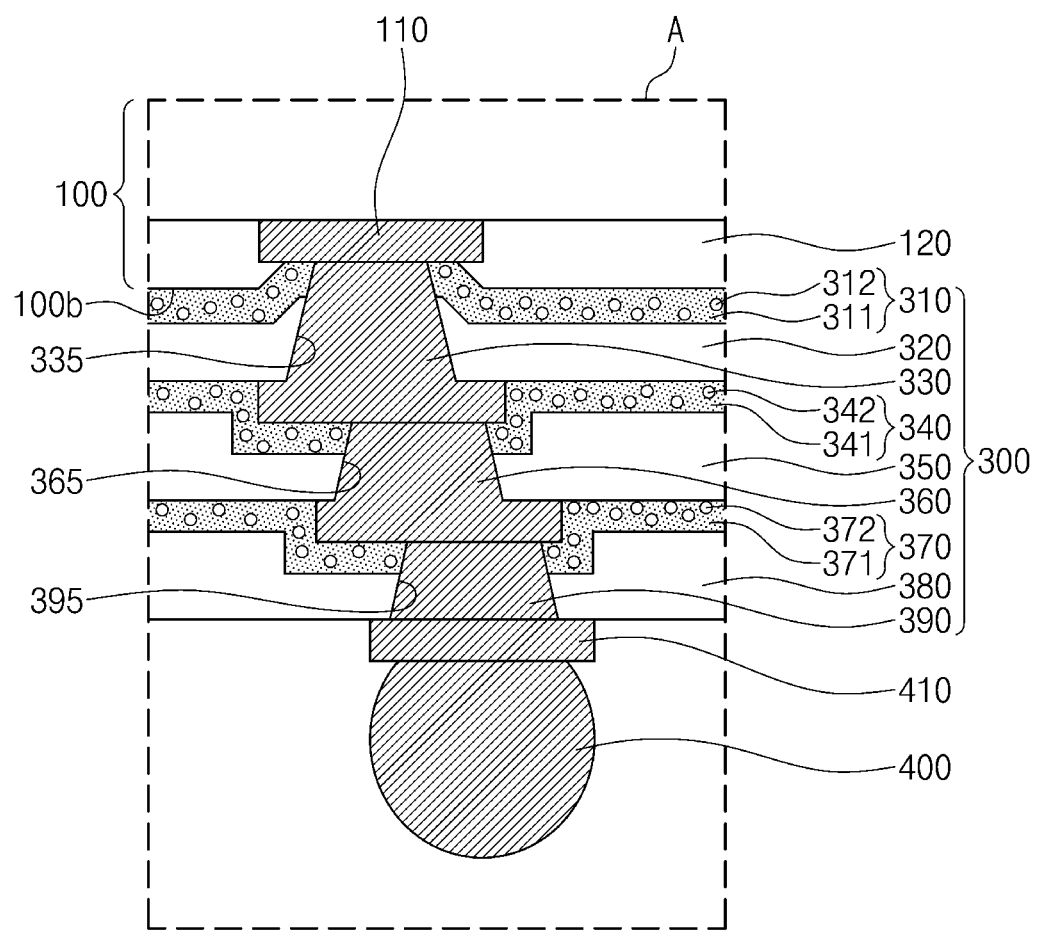

Referring to FIGS. 6A and 6B, a second opening 365 may be formed in the second lower insulating layer 350 and the second upper insulating layer 340. The second opening 365 may penetrate the second lower insulating layer 350 and the second upper insulating layer 340 and may expose the first redistribution pattern 330. The second opening 365 may be formed by substantially the same method as the formation example of the first opening 335 of FIGS. 3B and 3C or the formation example of the first opening 335 of FIGS. 3D to 3F. A second redistribution pattern 360 may be formed in the second opening 365. The second redistribution pattern 360 may be connected to the first redistribution pattern 330. The second redistribution pattern 360 may include a via portion 360A and an interconnection portion 360B (e.g., a horizontal wiring pattern extending on the second lower insulating layer 350). The second redistribution pattern 360 may be formed by substantially the same method as the formation method of the first redistribution pattern 330 and be formed of the same material and have the same connection characteristics as described with reference to FIGS. 4A to 4E. For example, a seed pattern may be formed in the second opening 365 and on the second lower insulating layer 350, and then, an electroplating process using the seed pattern may be performed to form the second redistribution pattern 360. The second redistribution pattern 360 may include, but not limited to, copper.

A third upper insulating layer 370 may be formed on the second lower insulating layer 350. As illustrated in FIG. 6B, the third upper insulating layer 370 may include a third polymer 371 and a third inorganic filler 372. The third upper insulating layer 370 may be formed in the same manner and contain the same materials as described herein with respect to the first upper insulating layer 310 (although they may be the same in the same device, they also may be different in the same device). The third inorganic filler 372 may comprise a plurality of particles, and the third inorganic filler 372 may be dispersed throughout the third polymer 371. The third polymer 371 may be formed with the material(s) described with respect to the examples of the first polymer 311 of FIGS. 2A and 2B. For example, the third polymer 371 may be a photosensitive polymer film, such as described herein. As another example, the third polymer 371 may be a non-photosensitive polymer film. The third inorganic filler 372 may be formed as described herein with respect to the examples of the first inorganic filler 312.

A third lower insulating layer 380 may be formed on and contact the third upper insulating layer 370. The third lower insulating layer 380 may be a photosensitive polymer film, such as those described elsewhere herein. The third lower insulating layer 380 may be a photosensitive polymer film identical to that of the first lower insulating layer 320 and may be formed of the same photosensitive polymer material as the third polymer 371. However, embodiments of the inventive concepts are not limited thereto. The third lower insulating layer 380 may not include an inorganic filler. Thus, a transmittance of the third lower insulating layer 380 may be greater than a transmittance of the third upper insulating layer 370. A thickness of the third lower insulating layer 380 may be greater than a thickness of the third upper insulating layer 370. For example, the thickness of the third upper insulating layer 370 may range from 10% to 70% of the thickness of the third lower insulating layer 380. The thickness of the third lower insulating layer 380 and the thickness of the third upper insulating layer 370 may be formed with the thicknesses described herein with respect to the thickness T1 of the first upper insulating layer 310 and the thickness T2 of the first lower insulating layer 320, respectively. The third lower insulating layer 380 and the third upper insulating layer 370 may be formed by a deposition process or a coating process, such as described elsewhere herein.

A third opening 395 may penetrate the third lower insulating layer 380 and the third upper insulating layer 370 to expose the second redistribution pattern 360. A third redistribution pattern 390 may be formed in the third opening 395. The third redistribution pattern 390 may include a conductive material such as copper. Even though not shown in the drawings, the third redistribution pattern 390 may further extend horizontally (e.g., a horizontal wiring) on the third lower insulating layer 380 and may be formed of the same material and have the same connection characteristics as described with reference to FIGS. 4A to 4E.

A connection pad 410 and a connection terminal 400 may be formed on the third redistribution pattern 390. The connection pad 410 may be formed between the connection terminal 400 and the third redistribution pattern 390. The connection terminal 400 may be electrically connected to the third redistribution pattern 390. Each connection terminal 400 may be electrically connected to a corresponding one of the chip pads 110 through the redistribution patterns 330, 360, and 390. The connection terminal 400 need not overlap with the chip pad 110 when viewed in a plan view. For example, the connection terminal 400 may not be aligned with the chip pad 110 in the second direction D2. As illustrated in FIG. 6A, a plurality of the connection terminals 400 are provided, and at least one of the connection terminals 400 may be provided directly under molding layer 200 so as to overlap with molding layer 200 when viewed in a plan view. Since the redistribution patterns 330, 360, and 390 are provided, the location of the connection terminals 400 may be disposed freely regardless of a position of the chip pad 110. As will be appreciated, the redistribution patterns 330, 360 and 390 may comprise a plurality of discrete wirings that are electrically separate from one another (i.e., to communicate different signals and/or power between the chip pads 110 and corresponding electrically connected connection terminals 400). Further, although the interconnection portions (such as 360B and 330B) are may form wirings extending horizontally in the left and right directions as shown in the cross sectional views of the Figures, each of such wirings may also extend in other horizontal directions (e.g., in a direction perpendicular to the vertical cross sections) and may follow a non-linear path (e.g., zig-zag) to provide a desired connection between a connection terminal 400 and a chip pad 110. Further, the discrete wirings may be used to provide electrical connections other than between a connection terminal 400 and a chip pad 110, such as between a connection terminal 400 and another semiconductor package stacked on semiconductor package 1 or between chip pads 110 of semiconductor chip 100 and other semiconductor chips within the semiconductor package 1 (not shown) or within another package stacked on semiconductor package 1 (see, e.g., FIGS. 10B and 10C). The connection terminal 400 may include a solder ball, a bump, or a pillar. The connection terminal 400 may be a conductive metal and may be solder or include solder. The fabrication of a semiconductor package 1 may be completed by the fabricating method described above.

Heat may be generated by the semiconductor chip 100 when the semiconductor package 1 operates. In some examples, the thermal conductivities of the inorganic fillers 312, 342 and 372 may be higher than those of the polymers 311, 341 and 371 and the lower insulating layers 320, 350 and 380. Thus, heat dissipation of heat generated by the semiconductor chip 100 may be improved by the inorganic fillers 312, 342 and 372. In some examples, the fillers 312, 342 and 372 may include different types of particles, such as a first type forming and/or comprising the ion trapping agent as described herein, and a second type forming the heat dissipation particle (having a higher thermal conductivity than the polymers 311, 341, 371 and the lower insulating layers 320, 350 and 380). In some examples, the particles of the fillers 312, 342 and 372 may form and/or comprise the ion trapping agent as described herein and also be such a heat dissipation particle as described herein.

Coefficients of thermal expansion of a redistribution layer 300 including the redistribution patterns 330, 360 and 390 may be different from a coefficient of thermal expansion of the semiconductor chip 100. For example, coefficients of thermal expansion of the redistribution patterns 330, 360 and 390 may be greater than the coefficient of thermal expansion of the semiconductor chip 100. If a difference in coefficient of thermal expansion between the redistribution layer 300 and the semiconductor chip 100 increases, warpage of the semiconductor package 1 may occur. According to some embodiments of the inventive concepts, coefficients of thermal expansion of the first to third inorganic fillers 312, 342 and 372 (which may form and/or comprise the ion trapping agent, such as described herein) may be less than those of the first to third polymers 311, 341 and 371. In addition, the coefficients of thermal expansion of the inorganic fillers 312, 342 and 372 may be less than those of the lower insulating layers 320, 350 and 380. For example, the coefficient of thermal expansion of each of the inorganic fillers 312, 342 and 372 may range from about 2 ppm/° C. to about 20 ppm/° C. The redistribution layer 300 may include the inorganic fillers 312, 342 and 372, and thus the difference in coefficient of thermal expansion between the redistribution layer 300 and the semiconductor chip 100 can be reduced. As a result, it is possible to minimize or prevent warpage of the semiconductor package 1 which may be caused in the fabricating processes. In some embodiments, the redistribution layer 300 may include the upper insulating layers 310, 340 and 370, the lower insulating layers 320, 350 and 380, and the redistribution patterns 330, 360 and 390.

The numbers of the upper insulating layers 310, 340 and 370, the lower insulating layers 320, 350 and 380 and the redistribution patterns 330, 360 and 390 may be variously changed. In an embodiment, a fourth upper insulating layer, a fourth lower insulating layer and a fourth redistribution pattern may further be formed between the third lower insulating layer 380 and the connection terminal 400, such as described herein regarding other insulating layer/redistribution pattern combinations. In another embodiment, the third upper insulating layer 370, the third lower insulating layer 380 and the third redistribution pattern 390 may be omitted. In still another embodiment, at least one of the first to third upper insulating layers 310, 340 and 370 may be omitted.

Figure 7B:
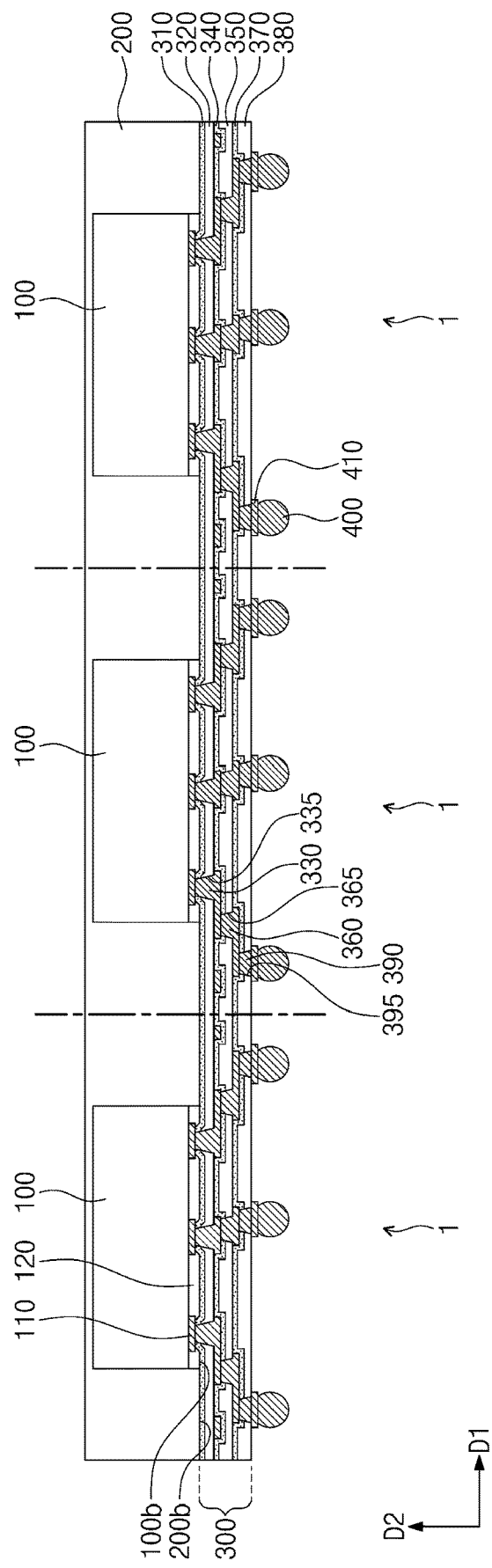

FIGS. 7A and 7B are cross-sectional views illustrating processes of fabricating a semiconductor package, according to some embodiments of the inventive concepts. Hereinafter, the descriptions to the same elements as in the above embodiments will be omitted or mentioned briefly for the purpose of ease and convenience in explanation.

Referring to FIG. 7A, a semiconductor chip 100 may be provided on a carrier substrate 910. The semiconductor chip 100 may be provided in plurality on the carrier substrate 910. A molding layer 200 may be provided on the carrier substrate 910 to cover the semiconductor chips 100. Thereafter, the carrier substrate 910 may be removed to expose a bottom surface 200b of the molding layer 200 and bottom surfaces 100b of the semiconductor chips 100.

Referring to FIG. 7B, a redistribution layer 300 may be formed on the exposed bottom surface 200b of the molding layer 200 and the exposed bottom surfaces 100b of the semiconductor chips 100. The redistribution layer 300 may include upper insulating layers 310, 340 and 370, lower insulating layers 320, 350 and 380, and redistribution patterns 330, 360 and 390. The redistribution layer 300 may be formed by the same method as described with reference to FIGS. 1 to 6B. In addition, the redistribution layer 300 may be formed at a panel level or a wafer level so that plural redistribution layers 300 are formed at the same time for each semiconductor package as a unitary, integral layer. The unitary integral layer forming the plurality of redistribution layers 300 of each semiconductor package may then be separated from one another as each semiconductor package is singulated or cut from the unitary, integrally formed structure (e.g., such as that shown in FIG. 7B). Alternatively, none or only some of the semiconductor packages may be cut from the unitary, integrally formed structure (e.g., such as when forming a display formed of plurality of LED chips). FIG. 7A illustrates an example of a plurality of semiconductor chips 100 being subjected to a molding process simultaneously to provide molding layer 200 surrounding the plurality of semiconductor chips 100. The molding process may be performed when the plurality of semiconductor chips 100 are mounted on a carrier substrate 910, which may be then subsequently removed (as indicated by the dashed line in FIG. 7A). Then, as shown in FIG. 7B, a plurality of redistribution layers 300 (integrally formed as a unitary structure) may be formed for each semiconductor package (here, corresponding to each semiconductor chip 100, but may instead correspond to a plurality of semiconductor chips 100, either stacked and/or groups previously horizontally positioned and attached to carrier substrate 910). Connection pads 410 and connection terminals 400 may be formed on a bottom surface of the redistribution layer 300. A plurality of semiconductor packages 1 may thus be fabricated at the same time and, at least initially, be formed as an integral, unitary structure (such as the structure shown in FIG. 7B). The semiconductor packages 1 may be separated by one another, such as by cutting the molding layer 200 and the redistribution layer 300 along the dashed lines of FIG. 7B. The description of FIGS. 7A and 7B show an example of fabricating semiconductor packages 1 at a panel level, but the semiconductor packages 1 may be fabricated at a chip level (e.g., forming a semiconductor packages separately, e.g., where the molding layer 200 is formed to separately for each semiconductor package) or at a wafer level (e.g., prior to separating semiconductor chips 100 from a semiconductor wafer in which each of the semiconductor chips 100 are formed, the redistribution layers 300 are formed and then the semiconductor chips 100, each with corresponding redistribution layer 300, are separated from one another). Hereinafter, a single semiconductor package 1 will be described and illustrated for the purpose of ease and convenience in explanation and illustration, although it will be understood that such descriptions also apply to fabricating the semiconductor packages 1 at a panel level or wafer level.

FIGS. 8A to 8D are cross-sectional views illustrating a method of fabricating a semiconductor package, according to some embodiments of the inventive concepts, and which may be used to fabricate the semiconductor packages described herein. Hereinafter, the descriptions of the same elements as in the above embodiments will be omitted or mentioned briefly for the purpose of ease and convenience in explanation.

Figure 8A:
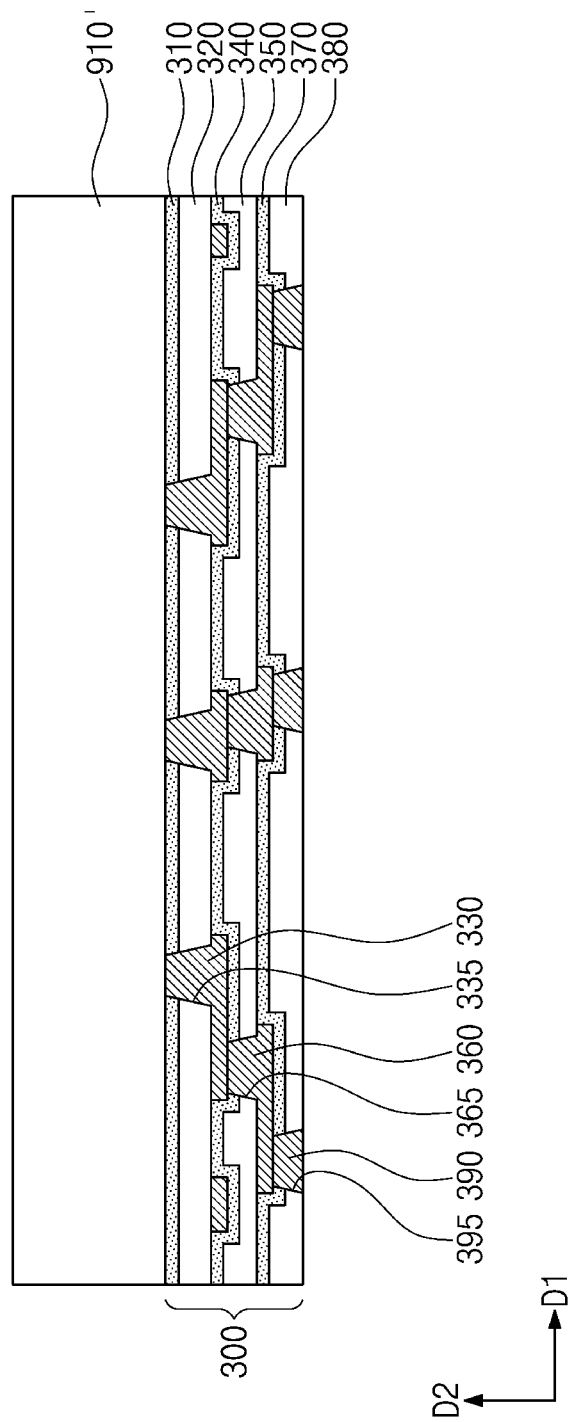
FIGS. 8A to 8D are cross-sectional views illustrating a method of fabricating a semiconductor package, according to some embodiments of the inventive concepts.

Referring to FIG. 8A, a first upper insulating layer 310 and a first lower insulating layer 320 may be formed on a first carrier substrate 910'. The first upper insulating layer 310 may include the first polymer 311 and the first inorganic filler 312, as illustrated in FIG. 6B. The first lower insulating layer 320 may cover the first upper insulating layer 310. The first lower insulating layer 320 may be the photosensitive polymer film such as described herein. A first opening 335 may be formed in the first upper insulating layer 310 and the first lower insulating layer 320. The first opening 335 may expose the first carrier substrate 910'. The first opening 335 may be formed by the same method as the formation example of the first opening 335 of FIGS. 3B and 3C or the formation example of the first opening 335 of FIGS. 3D to 3F. A first redistribution pattern 330 may be formed in the first opening 335 and on the first lower insulating layer 320.

A second upper insulating layer 340 and a second lower insulating layer 350 may be formed on the first lower insulating layer 320. A second opening 365 may be formed to expose the first redistribution pattern 330. The second opening 365 may penetrate the second upper insulating layer 340 and the second lower insulating layer 350. A second redistribution pattern 360 may be formed in the second opening 365 and on the second lower insulating layer 350.

A third upper insulating layer 370 and a third lower insulating layer 380 may be formed on the second lower insulating layer 350. A third opening 395 may be formed in the third upper insulating layer 370 and the third lower insulating layer 380. The third opening 395 may penetrate the third upper insulating layer 370 and the third lower insulating layer 380. A third redistribution pattern 390 may be formed in the third opening 395 and may be connected to the second redistribution pattern 360. Thus, a redistribution layer 300 may be fabricated. The redistribution layer 300 may include the upper insulating layers 310, 340 and 370, the lower insulating layers 320, 350 and 380, and the redistribution patterns 330, 360 and 390.

Figure 8B:
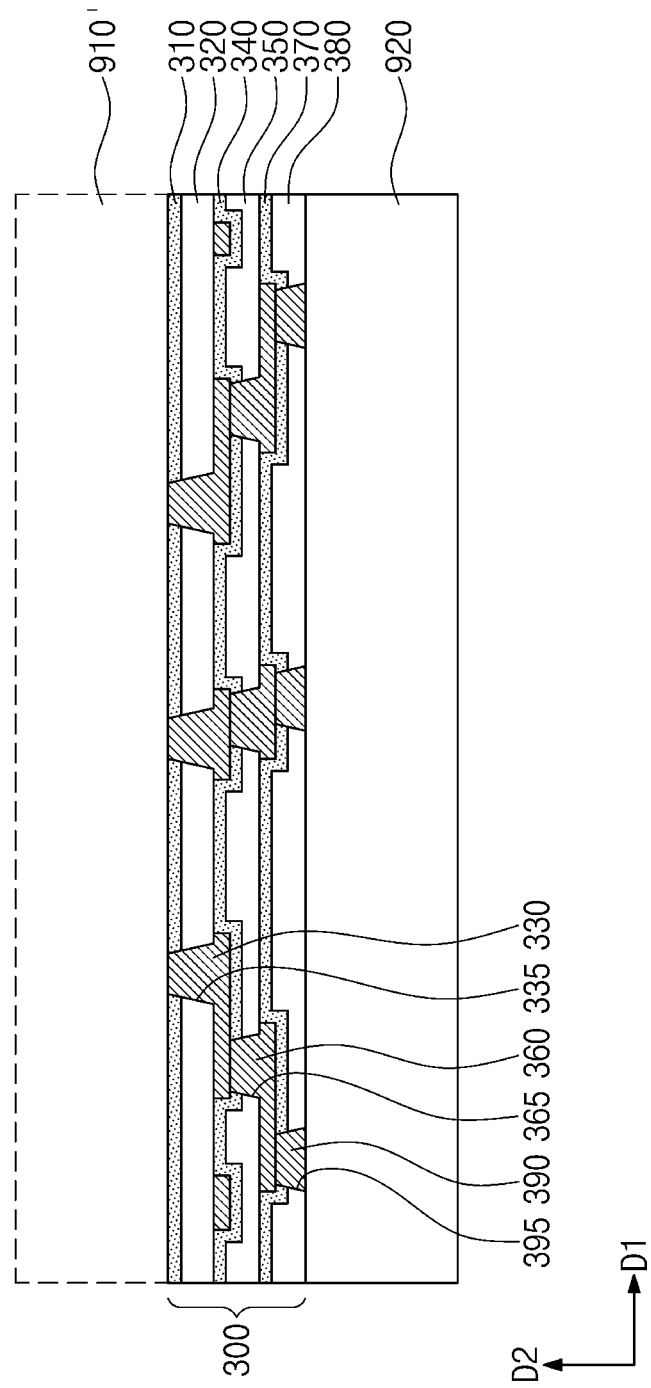

Referring to FIG. 8B, a second carrier substrate 920 may be attached to the third lower insulating layer 380 (e.g., with adhesive). Thereafter, the first carrier substrate 910' may be removed to expose the first upper insulating layer 310 and the first redistribution pattern 330.

Figure 8C:
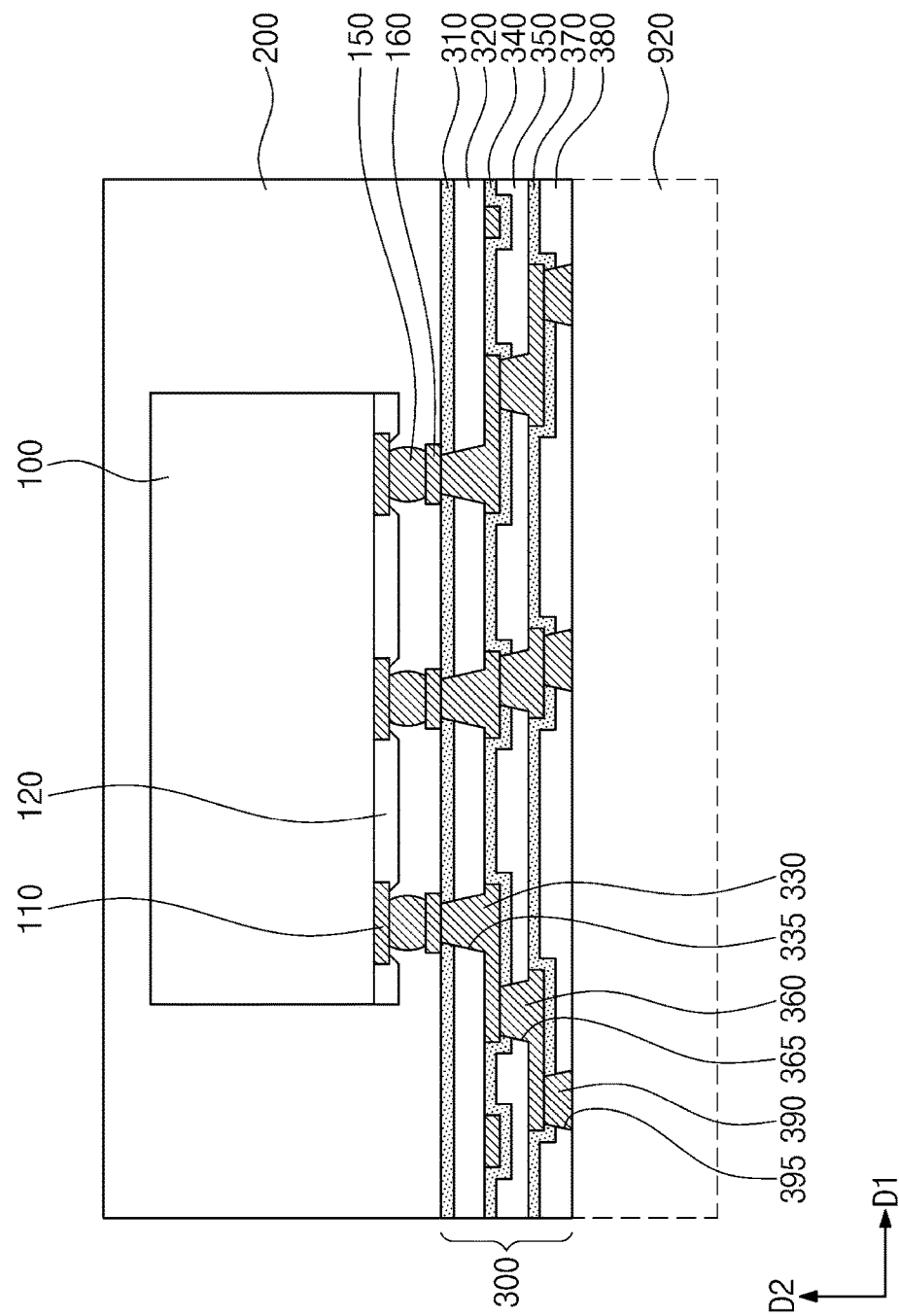

Referring to FIG. 8C, a semiconductor chip 100 may be disposed on the redistribution layer 300 and may be electrically connected to the redistribution patterns 330, 360 and 390 of the redistribution layer 300.

According to some embodiments, after removal of the first carrier substrate 910' as shown in FIG. 8B, conductive pads 160 may then be formed on the exposed portions of the first redistribution pattern 330. Alternatively, before the first redistribution pattern 330 is formed in FIG. 8A, the conductive pads 160 may be formed on the first carrier substrate 910' and the redistribution pattern 330 may then be formed to contact corresponding ones of the conductive pads 160. The semiconductor chip 100 may be disposed on the first upper insulating layer 310 in such a way that a chip pad 110 of the semiconductor chip 100 faces the redistribution layer 300. Connection portions 150 may be formed between corresponding chip pad 110 and conductive pad 160 pairs. The connection portion 150 may be or include a solder ball, a solder pillar, or a solder bump. Each connection portion 150 may electrically connect a chip pad 110 to a corresponding conductive pad 160. Thus, the semiconductor chip 100 may be electrically connected to the redistribution patterns 330, 360 and 390.

A molding layer 200 may be formed on the redistribution layer 300 (e.g., the first upper insulating layer 310) to cover the semiconductor chip 100. Alternatively, the molding layer 200 may cover a sidewall of the semiconductor chip 100 but may leave a top surface of the semiconductor chip 100 exposed. The molding layer 200 may extend into a gap between the semiconductor chip 100 and the redistribution layer 300 to encase and surround the connection portions 150. Thereafter, the second carrier substrate 920 may be removed to expose the third lower insulating layer 380 and portions of the third redistribution pattern 390.

Figure 8D:
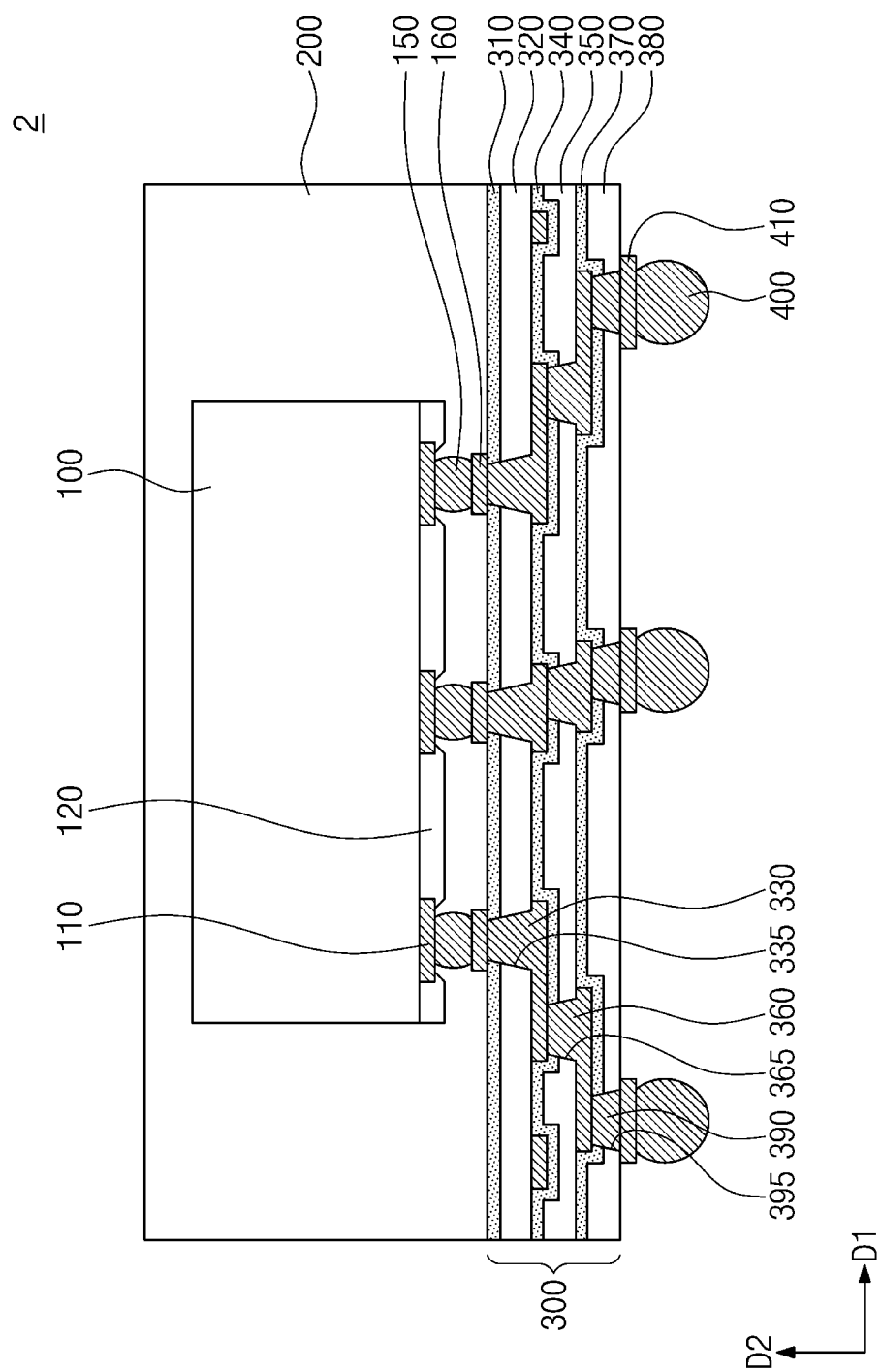

Referring to FIG. 8D, a connection pad 410 and a connection terminal 400 may be formed on a bottom surface of the redistribution layer 300. The connection terminal 400 may be electrically connected to the third redistribution pattern 390. As a result, a semiconductor package 2 may be fabricated.

Figure 9:
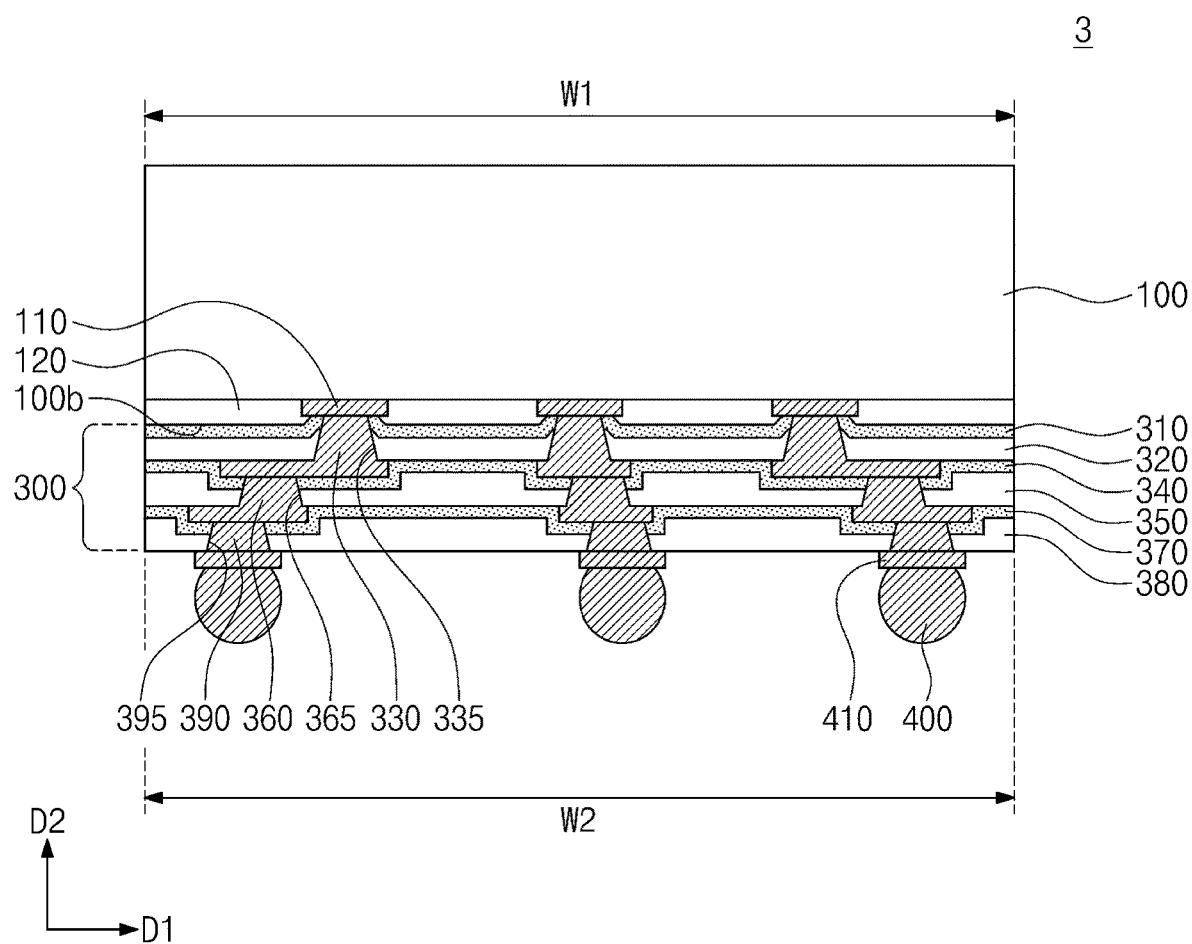
FIG. 9 is a cross-sectional view illustrating a semiconductor package according to some embodiments of the inventive concepts.

FIG. 9 is a cross-sectional view illustrating a semiconductor package according to some embodiments of the inventive concepts. Hereinafter, the descriptions to the same elements as in the above embodiments will be omitted or mentioned briefly for the purpose of ease and convenience in explanation.

Referring to FIG. 9, a semiconductor package 3 may include a redistribution layer 300 and a semiconductor chip 100. However, the molding layer 200 may be omitted from the semiconductor package 3, unlike the semiconductor package 1 of FIGS. 6A and 6B and the semiconductor package 2 of FIG. 8D. A width W1 of the semiconductor chip 100 may be substantially equal to a width W2 of the redistribution layer 300.

A first upper insulating layer 310, a first lower insulating layer 320, a first redistribution pattern 330, a second upper insulating layer 340, a second lower insulating layer 350, a second redistribution pattern 360, a third upper insulating layer 370, a third lower insulating layer 380 and a third redistribution pattern 390 may be formed on a bottom surface 100b of the semiconductor chip 100 to fabricate the redistribution layer 300. The first upper insulating layer 310 may be disposed between the first lower insulating layer 320 and the semiconductor chip 100.

Alternatively, the semiconductor package 3 may be fabricated by substantially the same method as described with reference to FIGS. 8A to 8D. Here, the molding layer 200 may not be formed. In this case, a connection portion (see 150 of FIG. 8D) may further be formed between the chip pad 110 and the first redistribution pattern 330.

Figure 10A:
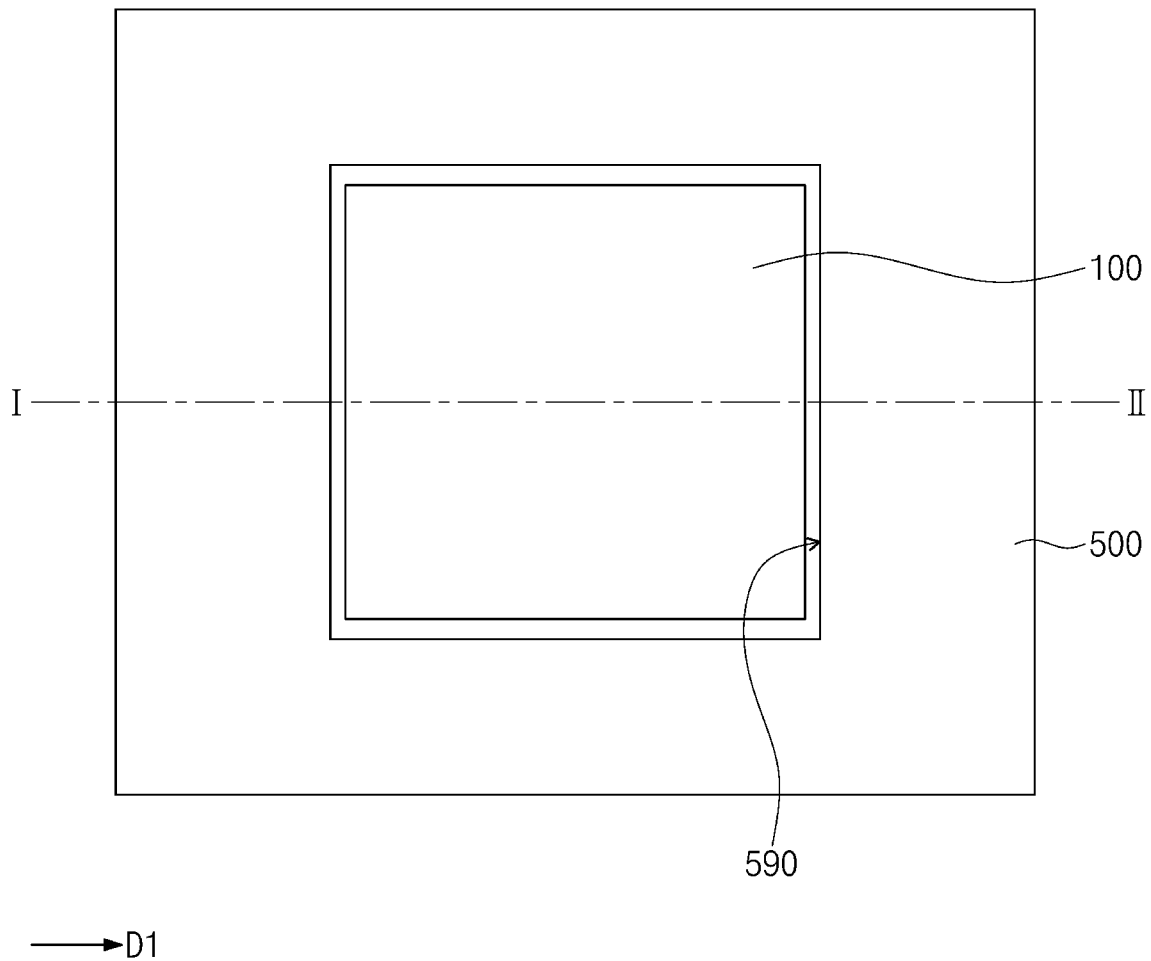
FIG. 10A is a plan view illustrating a semiconductor package according to some embodiments of the inventive concepts.
Figure 10B:
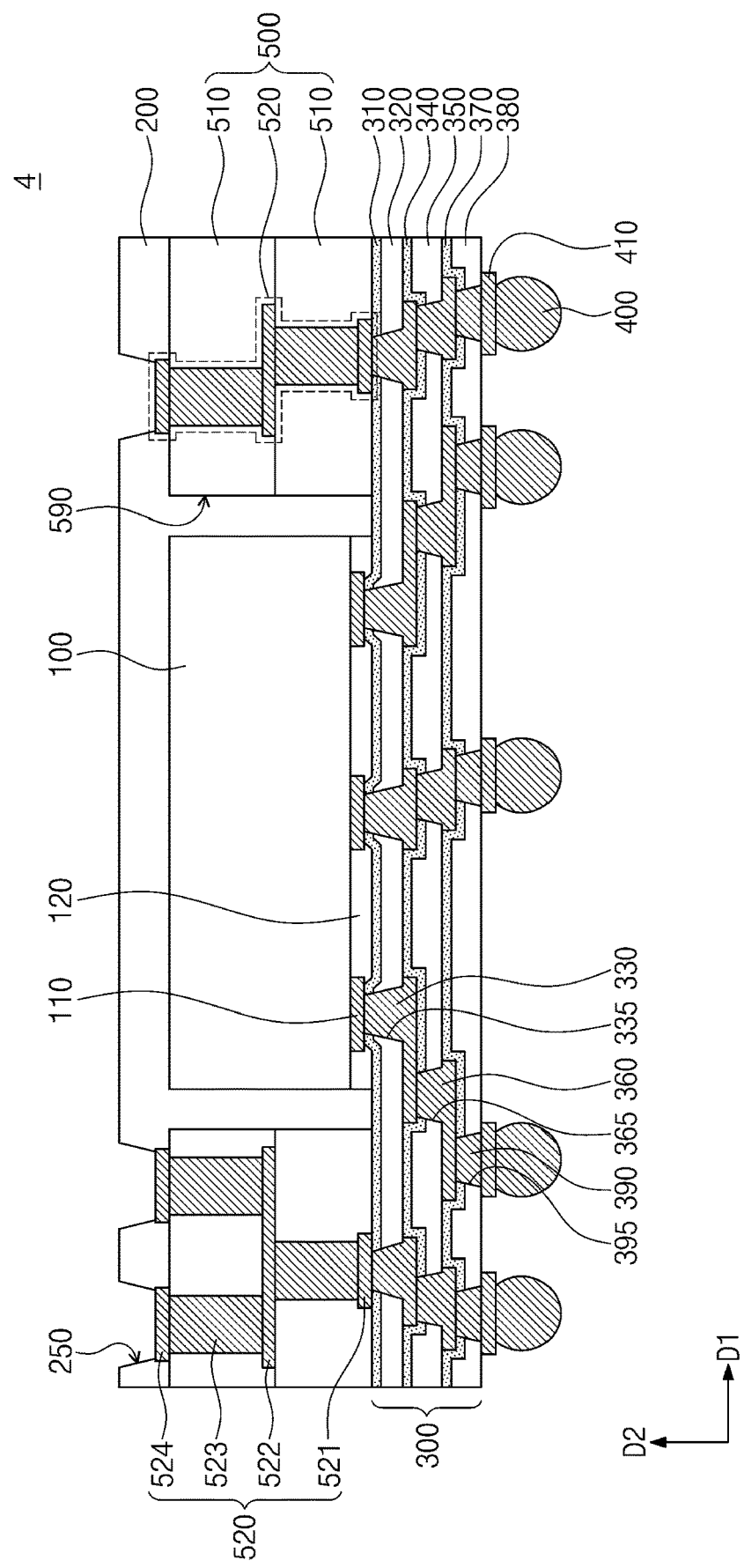
FIG. 10B is a cross-sectional view taken along a line I-II of FIG. 10A.

FIG. 10A is a plan view illustrating a semiconductor package according to some embodiments of the inventive concepts. FIG. 10B is a cross-sectional view taken along a line I-II of FIG. 10A. Hereinafter, the descriptions to the same elements as in the above embodiments will be omitted or mentioned briefly for the purpose of ease and convenience in explanation.

Referring to FIGS. 10A and 10B, a semiconductor package 4 may include a redistribution layer 300, a semiconductor chip 100, a molding layer 200, and an interconnection substrate 500. The redistribution layer 300, the semiconductor chip 100 and the molding layer 200 may be substantially the same as described above.

The interconnection substrate 500 may include base layers 510 and a conductive structure 520 disposed in the base layers 510. For example, a printed circuit board (PCB) may be used as the interconnection substrate 500. The conductive structure 520 may include plurality of separate conductive wirings formed of a lower metal pattern 521, an intermediate metal pattern 522, vias 523, and an upper metal pattern 524. The lower metal pattern 521 may be exposed at a bottom surface of the interconnection substrate 500. The vias 523 may penetrate at least one of the base layers 510. The intermediate metal pattern 522 may be disposed between the base layers 510 and may be connected to the vias 523. The upper metal pattern 524 may be exposed at a top surface of the interconnection substrate 500. The upper metal pattern 524 may be electrically connected to the lower metal pattern 521 through the intermediate metal pattern 522 and the vias 523. The upper metal pattern 524 may not be aligned with the lower metal pattern 521 in the second direction D2. The number of the upper metal pattern(s) 524 may be different from the number of the lower metal pattern(s) 521. In some examples, the intermediate metal pattern 522 may be omitted and the upper metal pattern 524 may be aligned with the lower metal pattern 521 in the second direction D2. The interconnection substrate 500 may further include a passive element (not shown) disposed therein and connected to one or more of the wirings of the interconnection substrate 500. The passive element may be a capacitor, a resistor, and/or an inductor.

The semiconductor chip 100 may be provided in a cavity 590 of the interconnection substrate 500. The cavity 590 may penetrate through the interconnection substrate 500. The molding layer 200 may be formed on the redistribution layer 300 and may cover top surfaces of the semiconductor chip 100 and the interconnection substrate 500. The molding layer 200 may extend into a gap between the interconnection substrate 500 and the semiconductor chip 100. A hole 250 may be formed in the molding layer 200 and may expose the upper metal pattern 524. In certain embodiments, a solder ball (not shown) may be provided on the upper metal pattern 524 and the hole 250 may expose the solder ball.

The redistribution layer 300 may be formed on a bottom surface of the semiconductor chip 100 and a bottom surface of the interconnection substrate 500, and may have the structure and be formed as described elsewhere herein. The redistribution layer 300 may include the upper insulating layers 310, 340 and 370, the lower insulating layers 320, 350 and 380, and the redistribution patterns 330, 360 and 390. The redistribution layer 300 may include a plurality of first redistribution patterns 330. Some of the first redistribution patterns 330 may extend between and electrically connect a corresponding chip pad 110 of the semiconductor chip 100 and a corresponding lower metal pattern 521. The redistribution patterns 330, 360 and 390 may be interconnected to form separate wirings of the redistribution layer 300 and such wirings may extend between and electrically connect a corresponding chip pad 110 and a corresponding connection pad 410 and/or connection terminal 400, or may extend between and electrically connect a corresponding lower metal pattern 521 and a corresponding connection pad 410 and/or connection terminal 400 (some of such wirings may also be connected to a corresponding chip pad 110 and some of which may not have any electrical connection to a chip pad 110 or other electrical component of the semiconductor chip 100). The interconnection substrate 500 may electrically connect various ones of the connection terminals 400, chip pads 110 of the semiconductor chip 100 and lower metal patterns 521 through the redistribution patterns 330, 360 and 390. The redistribution layer 300 may be formed by the method described with reference to FIGS. 2 to 6B. Alternatively, the redistribution layer 300 may be formed by the method described with reference to FIGS. 8A to 8C. In this case, even though not shown in the drawings, the connection portion 150 (see FIG. 8D) may be provided in plurality, and the connection portions 150 may be disposed between the chip pad 110 and one of the first redistribution patterns 330 and between the lower metal pattern 521 and another of the first redistribution patterns 330.

Figure 10C:
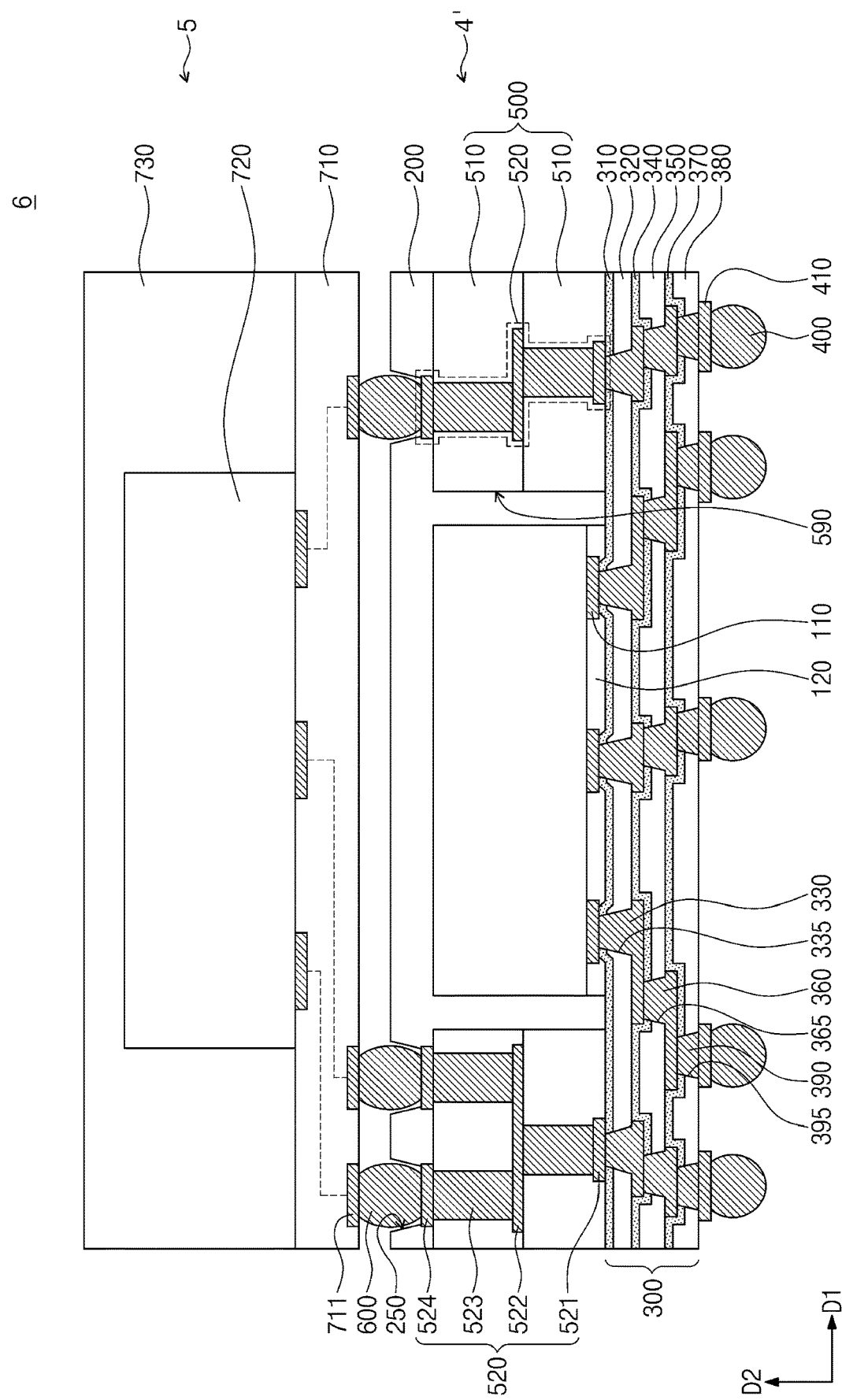
FIG. 10C is a cross-sectional view illustrating a semiconductor package according to some embodiments of the inventive concepts.

FIG. 10C is a cross-sectional view corresponding to the line I-II of FIG. 10A to illustrate a semiconductor package according to some embodiments of the inventive concepts. Hereinafter, the descriptions to the same elements as in the above embodiments will be omitted or mentioned briefly for the purpose of ease and convenience in explanation.

Referring to FIGS. 10A and 10C, a semiconductor package 6 may include a first semiconductor package 4' and a second semiconductor package 5. The first semiconductor package 4' may be the same as the semiconductor package 4 described with reference to FIGS. 10A and 10B. For example, the first semiconductor package 4' may include the redistribution layer 300, the semiconductor chip 100, the interconnection substrate 500, and the molding layer 200. The second semiconductor package 5 may be disposed on the first semiconductor package 4'. The second semiconductor package 5 may include a package substrate 710, a semiconductor device 720 (e.g., a semiconductor chip), and a molding pattern 730. The package substrate 710 may be a printed circuit board (PCB). Alternatively, the redistribution layer 300 formed by the method of FIGS. 2 to 6B or the method of FIGS. 8A to 8C may be used as the package substrate 710 and the structure of the second semiconductor package 5 may be the same as the semiconductor packages described elsewhere herein with respect to other embodiments. A metal pad 711 may be disposed on a bottom surface of the package substrate 710. The semiconductor device 720 may be disposed on a top surface of the package substrate 710. The semiconductor device 720 may be a memory chip, a logic chip, or a combination thereof. As illustrated by a dotted line in FIG. 10C, the semiconductor device 720 (e.g., chip pads connected to internal circuits of the semiconductor device 720 to transmit signals and power) may be electrically connected to metal pads 711 through inner conductive lines (wiring) of the package substrate 710. In FIG. 10C, each dotted line in the package substrate 710 schematically illustrates an inner conductive line (wiring) in the package substrate 710. Thus, electrical connections described with respect to lower metal pattern 521 also extend to and apply to a corresponding metal pad 711 and a corresponding chip pad of the semiconductor device 720. The molding pattern 730 may be disposed on the package substrate 710 to encase and cover the semiconductor device 720, such as in a manner described herein.

A solder bump 600 may be disposed between the upper metal pattern 524 and the metal pad 711 to connect the upper metal pattern 524 to the metal pad 711. Thus, the second semiconductor package 5 may be electrically connected to the first semiconductor package 4' through the solder bump 600. According to some embodiments, since the conductive structure 520 is provided (e.g., as horizontally extending electrical wiring), the metal pad 711 may be disposed freely. As a result, circuit patterns (not shown) in the package substrate 710 may be disposed freely.

Figure 11B:
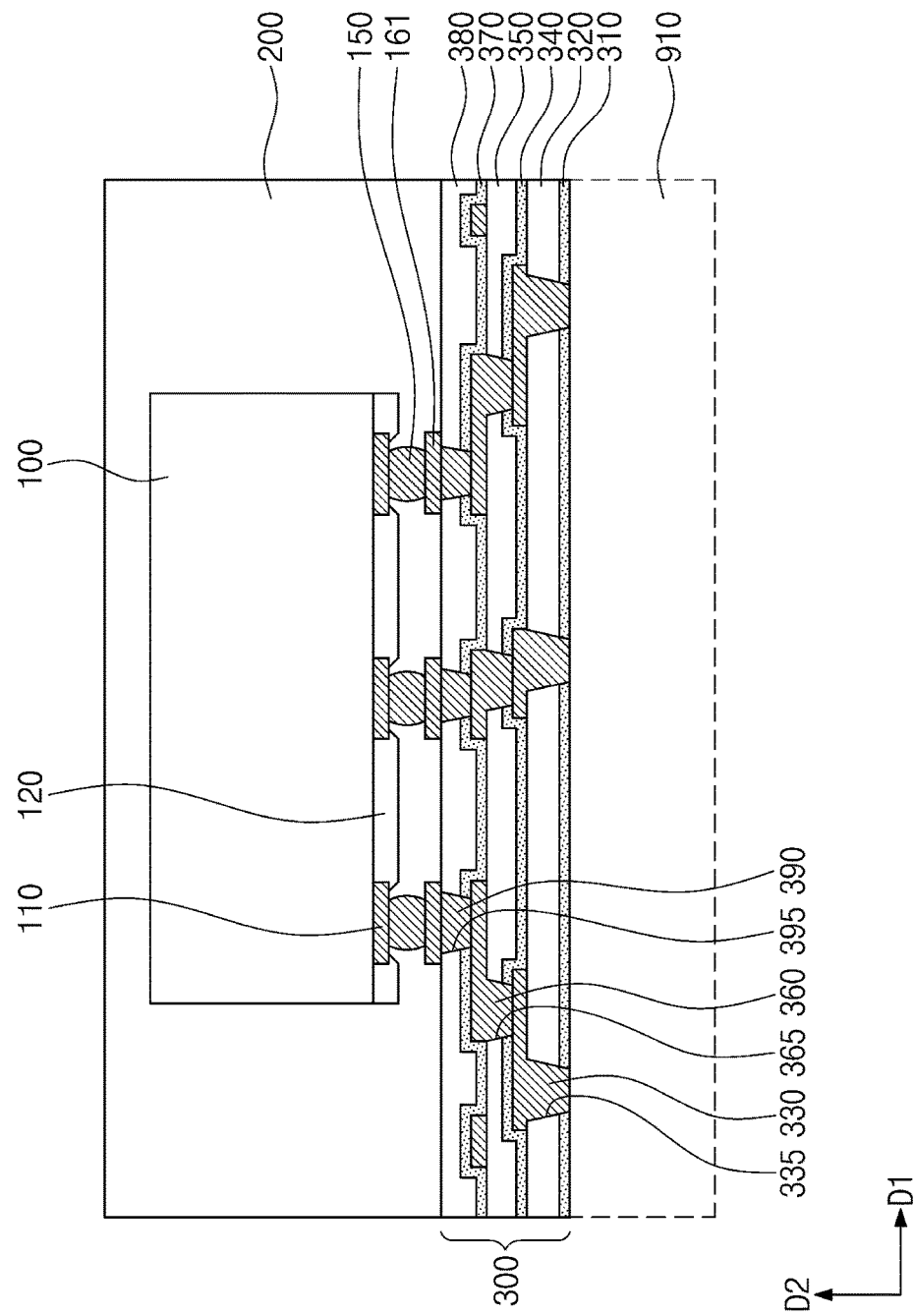
Figure 11C:
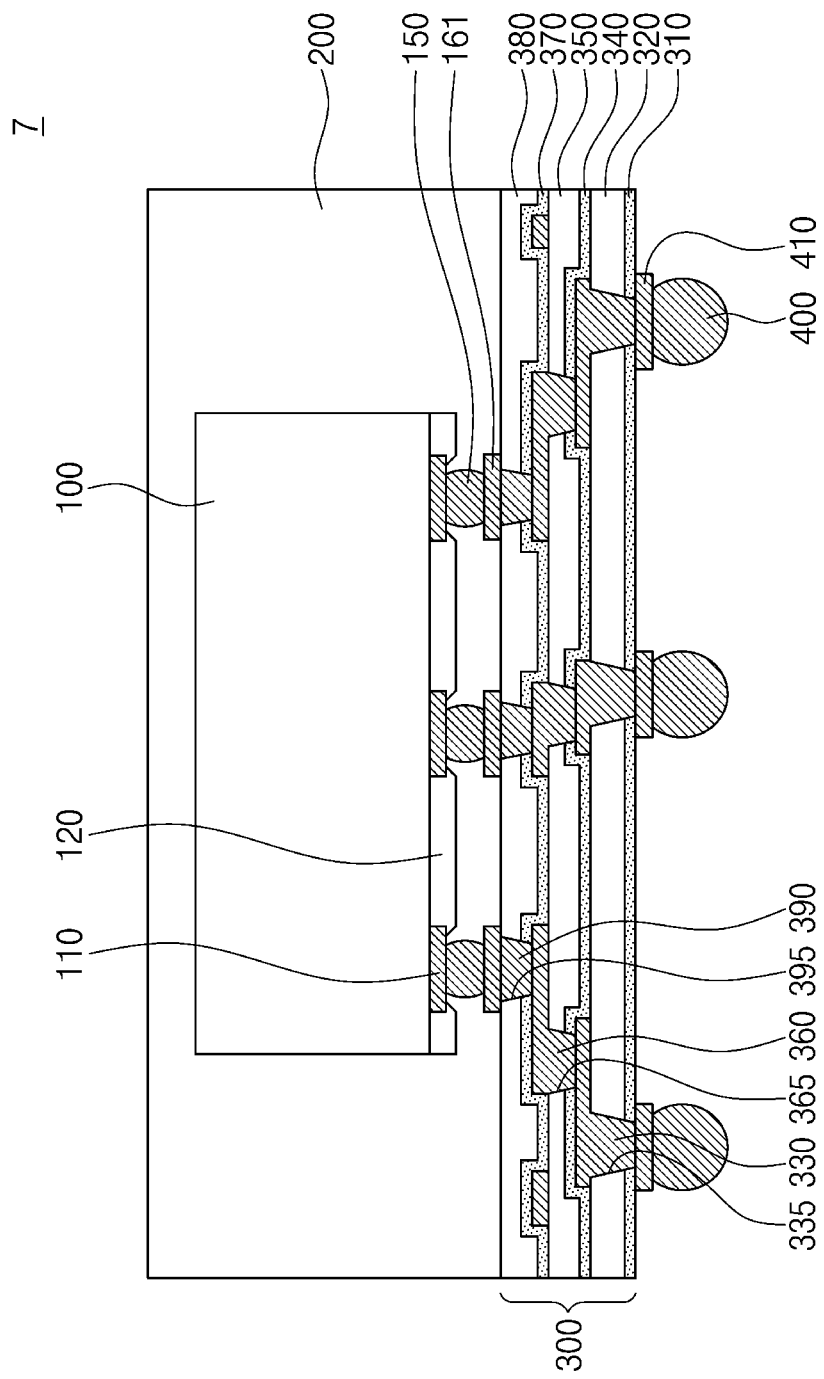

FIGS. 11A to 11C are cross-sectional views illustrating a method of fabricating a semiconductor package, according to some embodiments of the inventive concepts. Hereinafter, the descriptions to the same elements as in the above embodiments will be omitted or mentioned briefly for the purpose of ease and convenience in explanation.

Referring to FIG. 11A, a carrier substrate 910 may be prepared. A redistribution layer 300 may be formed on the carrier substrate 910. The redistribution layer 300 may be formed by the same method and have the same structure as described with reference to FIG. 8A. The redistribution layer 300 may include the upper insulating layers 310, 340 and 370, the lower insulating layers 320, 350 and 380, and the redistribution patterns 330, 360 and 390. The third redistribution pattern 390 may be exposed by the third lower insulating layer 380. A conductive pad 161 may be formed on the third redistribution pattern 390 and may be electrically connected to the third redistribution pattern 390.

Referring to FIG. 11B, a semiconductor chip 100 may be disposed on the redistribution layer 300 (e.g., the third lower insulating layer 380). The third lower insulating layer 380 may be disposed between the third upper insulating layer 370 and the semiconductor chip 100. At this time, the chip pad 110 of the semiconductor chip 100 may be aligned with the conductive pad 161. A connection portion 150 may be formed between the chip pad 110 and the conductive pad 161. The semiconductor chip 100 may be electrically connected to the redistribution patterns 330, 360 and 390 through the connection portion 150. A molding layer 200 may be formed on the third lower insulating layer 380 to cover the semiconductor chip 100. Alternatively, and unlike FIG. 11B, the molding layer 200 may cover a sidewall of the semiconductor chip 100 and leave a top surface of the semiconductor chip 100 exposed. The molding layer 200 may further extend into a gap between the semiconductor chip 100 and the third lower insulating layer 380. Thereafter, the carrier substrate 910 may be removed to expose the first upper insulating layer 310 and a portion of the first redistribution pattern 330.

Referring to FIG. 11C, a connection pad 410 and a connection terminal 400 may be formed on a bottom surface of the redistribution layer 300. The connection pad 410 may be formed between the connection terminal 400 and the first redistribution pattern 330. The connection terminal 400 may be electrically connected to the redistribution patterns 330, 360 and 390 through the connection pad 410. Thus, a semiconductor package 7 may be fabricated.

In certain embodiments, the semiconductor package 7 may further include the interconnection substrate 500 described with reference to FIGS. 10B and 10C. In this case, the redistribution layer 300 may further extend onto the bottom surface of the interconnection substrate 500 so as to be electrically connected to the conductive structure 520.

Figure 12:
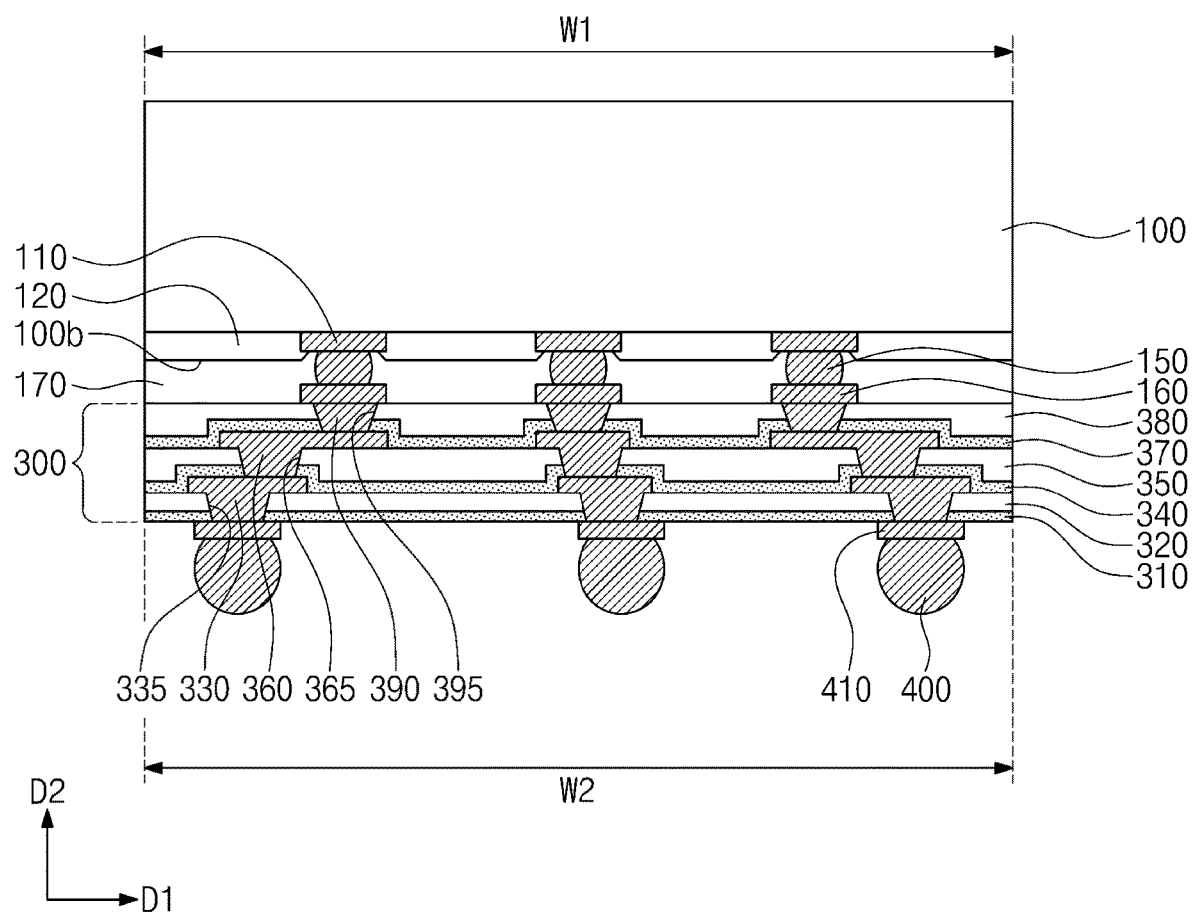
FIG. 12 is a cross-sectional view illustrating a semiconductor package according to some embodiments of the inventive concepts.

FIG. 12 is a cross-sectional view illustrating a semiconductor package according to some embodiments of the inventive concepts. Hereinafter, the descriptions to the same elements as in the above embodiments will be omitted or mentioned briefly for the purpose of ease and convenience in explanation.

Referring to FIG. 12, a semiconductor package 8 may include a redistribution layer 300 and a semiconductor chip 100. The molding layer 200 may be omitted. A width W1 of the semiconductor chip 100 may be substantially equal to a width W2 of the redistribution layer 300. Edges of the semiconductor chip 100 may be flush and may be coplanar with edges of the redistribution layer 300.

The semiconductor package 8 may be formed by substantially the same method as the method of fabricating the semiconductor package 7, described with reference to FIGS. 11A to 11C. However, an underfill pattern 170 may be formed between the semiconductor chip 100 and the third lower insulating layer 380. The underfill pattern 170 may surround the connection portion 150. The underfill pattern 170 may include an epoxy-based polymer. The third lower insulating layer 380 may be disposed between the third upper insulating layer 370 and the semiconductor chip 100.

Figure 13A:
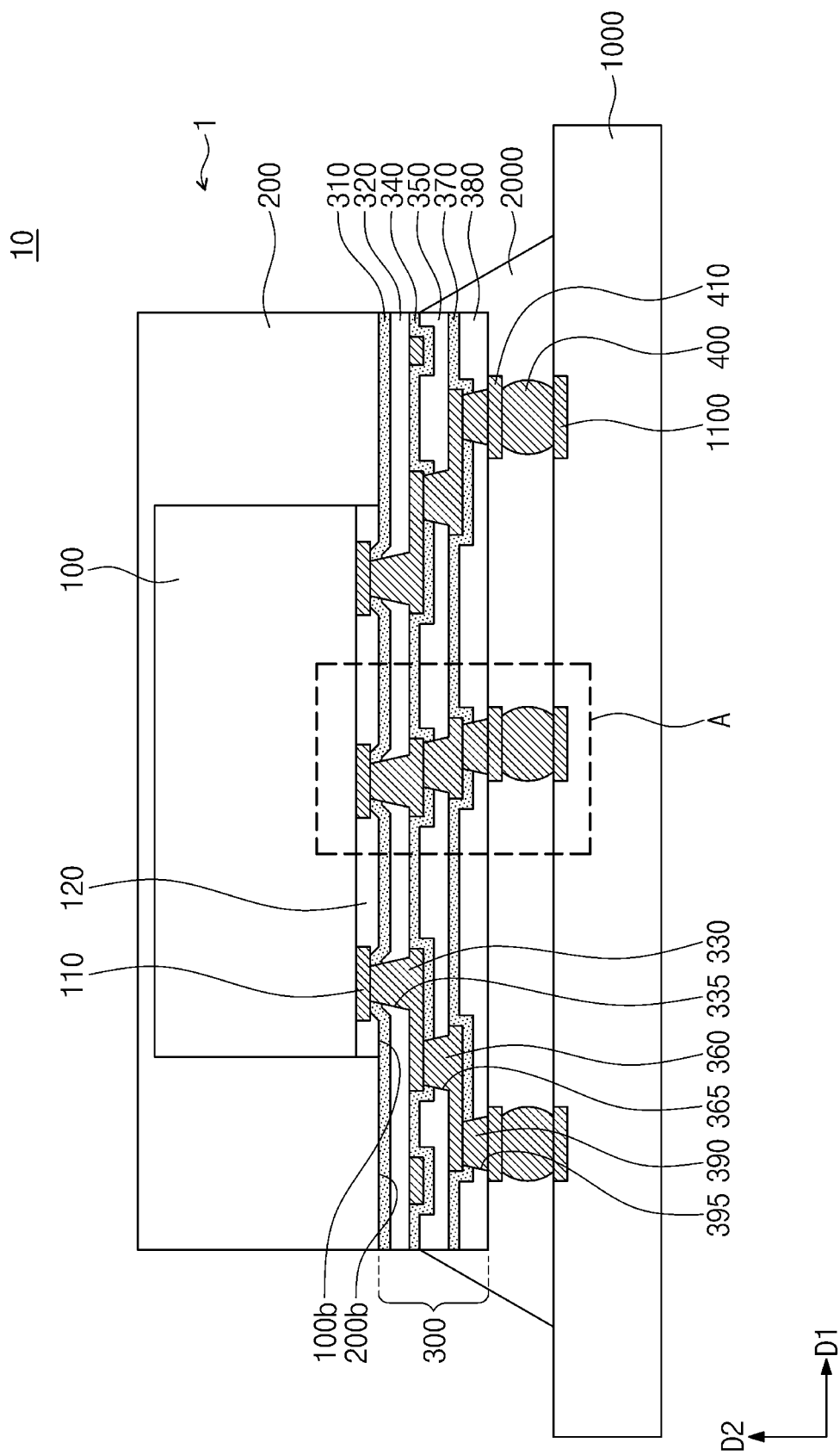
FIG. 13A is a cross-sectional view illustrating a semiconductor module according to some embodiments of the inventive concepts.
Figure 13B:
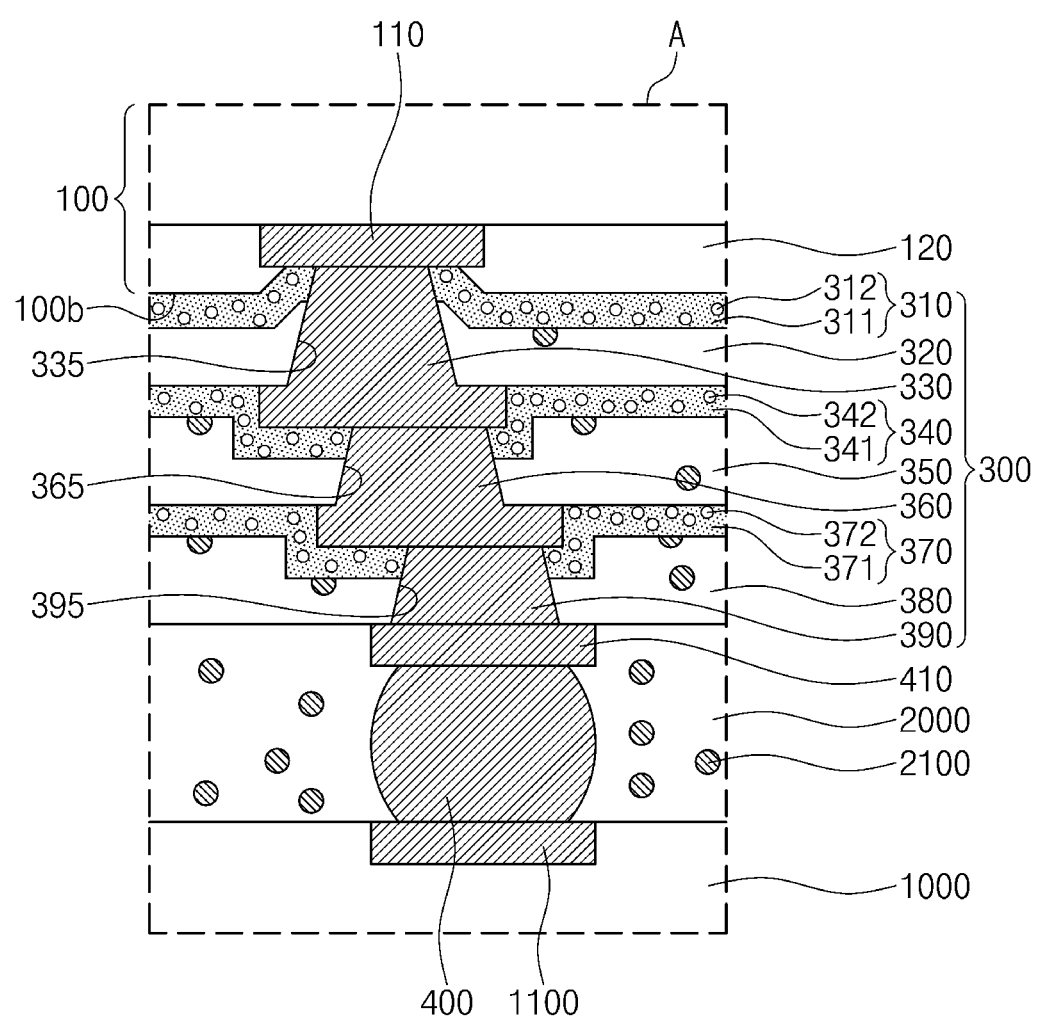
FIG. 13B is an enlarged view of a region 'A' of FIG. 13A.

FIG. 13A is a cross-sectional view illustrating a semiconductor module according to some embodiments of the inventive concepts. FIG. 13B is an enlarged view of a region 'A' of FIG. 13A. Hereinafter, the descriptions to the same elements as in the above embodiments will be omitted or mentioned briefly for the purpose of ease and convenience in explanation.

Referring to FIGS. 13A and 13B, a semiconductor module 10 may include a module substrate 1000, an underfill layer 2000 (an insulative encapsulant), and a semiconductor package 1. The module substrate 1000 may include a printed circuit board (PCB). The module substrate 1000 may have a module pad 1100 disposed on a top surface thereof. The semiconductor package 1 may be fabricated as described with reference to FIGS. 1 to 6B. In certain embodiments, the semiconductor package 1 mounted on the module substrate 1000 may be replaced with the semiconductor package 2 of FIG. 8D, the semiconductor package 3 of FIG. 9, the semiconductor package 4 of FIGS. 10A and 10B, the semiconductor package 6 of FIG. 10C, the semiconductor package 7 of FIG. 11C, or the semiconductor package 8 of FIG. 12. The connection terminal 400 may be connected to the module pad 1100. The semiconductor package 1 may be electrically connected to the module substrate 1000 through the connection terminal 400. The underfill layer 2000 may be disposed between the module substrate 1000 and the semiconductor package 1 to surround the connection terminal 400. The underfill layer 2000 may be in physical contact with the redistribution layer 300. The underfill layer 2000 may further extend onto the sidewall of the redistribution layer 300. The underfill layer 2000 be introduced into the space between the module substrate 1000 and the semiconductor package as a liquid to surround the connection terminal 400, and then may be cured to a hardened, solid monolithic encapsulant.

As illustrated in FIG. 13B, the underfill layer 2000 may include an epoxy-based polymer and a reactive material 2100. The reactive material 2100 may comprise charged particles, such as ions, such as a chlorine ion (Cl− or chloride), sodium ion (Na+), potassium ion (K+), hydroxide (OH−) and/or a hydrogen ion (H+). Certain ions, such as chlorine, sodium ions and potassium ions may be added to the epoxy-based polymer of the underfill layer 2000 to assist in flowing and evenly distributing the underfill layer 2000 during manufacturing. When a voltage or a current is applied to the semiconductor module 10, the reactive material 2100 in the underfill layer 2000 may migrate into the redistribution layer 300. For example, negatively charged chlorine ions (when forming reactive material 2100) will be attracted to and move towards the positive potential of the voltage source, resulting in both the chlorine ions and other material of the underfill layer 2000 (e.g., the epoxy-based ion) to flow towards the positive potential of the voltage source. If the reactive material 2100 comes in contact with the chip pad 110 of the semiconductor chip 100, the reactive material 2100 may chemically bond with the material of the chip pad 110, and the chip pad 110 may be damaged (e.g., corroded). Such chemical bonding and corrosion may occur at room temperature and/or an operating temperature of the semiconductor chip 100 (e.g., at 60 degrees C.). At least one of the inorganic fillers 312, 342 and 372 may include the ion trapping agent as described elsewhere herein. For example, the inorganic fillers 312, 342 and 372 may include at least one of the magnesium (Mg) compound, the alabamine (Ab) compound, or the bismuth (Bi) compound. In this case, the inorganic fillers 312, 342 and 372 may capture by chemically reacting with or adsorbing to the reactive material 2100 migrating into the redistribution layer 300. As a result, the reactive material 2100 may be passivated. For example, a resulting compound formed by combining the reactive material 2100 and the ion trapping agent does not chemically react with a chip pad 110 even if in contact with the chip pad. In some examples, this resulting compound may have a neutral charge and a larger molecular mass and thus have less tendency to migrate. In some examples, the reactive material 2100 may adsorb and adhere to the ion trapping particles of the inorganic fillers 312, 342 and 372 to reduce and/or substantially prevent the migration of the reactive material 2100. It should be appreciated that semiconductor packages and methods for making such semiconductor packages according to some exemplary embodiment may include filler particles (as described herein) combined with the reactive material 2100 (as described herein, such as: Cl−, K+, Na+, OH− and H+), such as by a chemical reaction (which may result but need not result in a byproduct disassociated with the combining filler particle) and/or by adsorption (either chemical or physical adsorption). For example, the following chemical reaction may occur and one or more of the resultant byproducts may be formed in the semiconductor package:

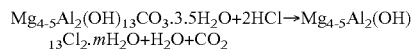

$$Mg_{4.5}Al_2(OH)_{13}CO_3 \cdot 3.5H_2O + 2HCl \rightarrow Mg_{4.5}Al_2(OH)_{13}Cl_2 \cdot mH_2O + H_2O + CO_2$$

Thus, even though the reactive material 2100 migrates into the redistribution layer 300 it may be difficult for the reactive material 2100 to pass through the upper insulating layers 310, 340 and 370 to contact a chip pad 110 or other conductive elements within the semiconductor package. As a result, it is possible to inhibit or prevent the chip pad 110 from being damaged by the reactive material 2100.

According to some embodiments of the inventive concepts, the thickness T1 of the first upper insulating layer 310 may be equal to or greater than 10% of the thickness T2 of the first lower insulating layer 320. In addition, the thickness of the second upper insulating layer 340 may be equal to or greater than 10% of the thickness of the second lower insulating layer 350. Likewise, the thickness of the third upper insulating layer 370 may be equal to or greater than 10% of the thickness of the third lower insulating layer 380.

As can be appreciated, the formation of the RDL layer 300 as described herein may be performed at the wafer level and thus the packages described herein may be wafer level packages. Although not shown in the figures, by forming the RDL layer 300 at the wafer level, a plurality of semiconductor chips 100 may be packaged together. In some examples, the wafer of the wafer level packaging process may be the wafer in which the semiconductor chips 100 are formed prior to their separation (singulation) from this wafer. In this case, the redistribution layer 300 is added to this wafer while a plurality of semiconductor devices are integral with the semiconductor wafer and then the semiconductor devices and the redistribution layer are cut together to separate the semiconductor devices from each other (each semiconductor device now forming a semiconductor chip 100). Semiconductor package 3 illustrated in FIG. 9 may be formed with this process. In other examples, the wafer of the wafer level packaging process may be a carrier substrate, such as a wafer forming carrier substrates 910, 910' and/or 920 described herein, where the redistribution layer 300 for a plurality of semiconductor chips 100 is formed as one unitary integral layer (prior to separation into separate semiconductor packages) and a plurality of semiconductor chips 100 connected to this unitary integral layer are packaged together simultaneously (one example of this being described and illustrated in FIG. 7, but applicable to other semiconductor package processes described herein). It will also be appreciated that the plurality of semiconductor packages may be distributed in a two dimensional array while being packaged together at the wafer level (although the cross sectional view of FIG. 7 may only show a single row of such a two dimensional array).

According to some embodiments of the inventive concepts, the upper insulating layers and the lower insulating layers may be formed as part of fabrication of the redistribution layer. The upper insulating layers may be formed as a polymer film having the inorganic fillers formed therein. Thus, the upper insulating layers may inhibit or prevent the chip pad from being damaged by the reactive material. As a result, the reliability and the durability of the semiconductor package may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a semiconductor chip comprising an insulative protective layer and a plurality of conductive chip pads exposed through openings in the insulative protective layer; and
   a redistribution layer including:
   a plurality of insulating layers each comprising an organic film, and
   a plurality of conductive redistribution patterns, each of the conductive redistribution patterns comprising a conductive interconnection portion formed on a surface of a corresponding one of the insulating layers,
   wherein at least a first organic film of one of the plurality of insulating layers comprises a filler comprising a plurality of ion trapping particles formed of an inorganic material which is chemically reactive with at least one of the following ions: Cl−, K+, Na+, OH− and H+.

2. The semiconductor package of claim 1, wherein the first organic film comprises a photosensitive polymer film having the ion trapping particles of the filler dispersed therein.

3. The semiconductor package of claim 2, wherein at least some of the plurality of ion trapping particles of the filler are chemically combined with a corresponding chlorine ion.

4. The semiconductor package of claim 1, wherein the inorganic material of the filler comprises at least one of a magnesium (Mg) compound and a bismuth (Bi) compound.

5. The semiconductor package of claim 1,
   wherein the first organic film comprises a polymer film formed of a first polymer material and having the ion trapping particles of the filler dispersed therein,
   wherein the ion trapping particles have a thermal conductivity higher than that of the first polymer material.

6. The semiconductor package of claim 1,
   wherein the first organic film comprises a polymer film formed of a first polymer material and having the ion trapping particles of the filler dispersed therein,
   wherein the ion trapping particles have a coefficient of thermal expansion less than that of the first polymer material.

7. The semiconductor package of claim 1,
   wherein the plurality of conductive redistribution patterns comprise a first redistribution pattern in contact with a first chip pad of the conductive chip pads of the semiconductor chip.

8. The semiconductor package of claim 7, wherein the first organic film is in contact with the first chip pad.

9. The semiconductor package of claim 8, wherein the first chip pad has a surface exposed with respect to the insulative protection layer by a first hole in the insulative protection layer, and the exposed surface of the first chip pad is fully covered by the first organic film and the first redistribution pattern formed within the first hole.

10. The semiconductor package of claim 9, wherein the first redistribution pattern comprises a conductive via and a conductive interconnection integrally formed with the conductive via, wherein the conductive via is formed within the first hole of the insulative protection layer and in contact with the first chip pad and wherein the conductive interconnection is formed on the first organic film.

11. The semiconductor package of claim 1,
    wherein the first organic film is a first upper polymer film comprising a polymer material in which the ion trapping particles of the filler are dispersed,
    wherein the plurality of insulating layers comprise a first lower polymer film directly on the first upper polymer film,
    wherein the plurality of redistribution patterns comprise a first redistribution pattern in contact with a first chip pad of the conductive chip pads of the semiconductor chip and formed directly on the first lower polymer film,
    wherein the first lower polymer film is a photosensitive polymer film, and
    wherein the first upper polymer film has a thickness less than 70% of the thickness of the first lower polymer film.

12. A semiconductor package comprising:
    a semiconductor chip comprising an insulative protective layer and a plurality of conductive chip pads exposed through openings in the insulative protective layer; and a redistribution layer including:
a plurality of insulating layers each comprising an organic film, and
a plurality of conductive redistribution patterns, each of the conductive redistribution patterns comprising a conductive interconnection portion formed on a surface of a corresponding one of the insulating layers,
wherein at least one organic film of one of the plurality of insulating layers comprises a filler comprising a plurality of ion trapping particles formed of an inorganic material dispersed in the at least one organic film, the plurality of ion trapping particles comprised of a material that combines with a reactive material corrosive to the conductive chip pads.

13. The semiconductor package of claim 12,
wherein the at least one organic film comprises a polymer film formed of a first polymer material and having the ion trapping particles of the filler dispersed therein,
wherein the ion trapping particles have a thermal conductivity higher than that of the first polymer material.

14. The semiconductor package of claim 12,
wherein the at least one organic film comprises a first upper polymer film comprising a polymer material in which the ion trapping particles of the filler are dispersed and a first lower polymer film directly on the first upper polymer film,
wherein the plurality of redistribution patterns comprise a first redistribution pattern in contact with a first chip pad of the conductive chip pads of the semiconductor chip and formed directly on the first lower polymer film.

15. The semiconductor package of claim 14,
wherein the first redistribution pattern comprises a conductive via and a conductive interconnection integrally formed with the conductive via,
wherein the conductive via is formed within a hole penetrating the first upper polymer film and first lower polymer film, and the conductive via is in contact with the first chip pad, and
wherein the conductive interconnection is formed on the first lower polymer film.

16. The semiconductor package of claim 15, wherein the conductive via has a tapered shape to have a width at the first chip pad that is smaller than a width at the conductive interconnection.

17. The semiconductor package of claim 15, wherein the conductive via and the conductive interconnection are formed of copper.

18. A method of manufacturing comprising:
forming at least one first insulating layer on a first surface of a semiconductor chip, the first surface of the semiconductor chip comprising a plurality of metal chip pads to provide signals and power to the semiconductor chip, the plurality of metal chip pads including a first chip pad;
patterning the at least one first insulating layer to expose the metal chip pads of the semiconductor chip through corresponding openings in the at least one first insulating layer; and
forming a first redistribution pattern on the first insulating layer, the first redistribution pattern comprising a first via contacting the first chip pad and a first interconnection portion connected to the first via extending horizontally on the at least one first insulating layer,
wherein the at least one first insulating layer comprises an organic film including a plurality of ion trapping particles dispersed therein, the ion trapping particles comprising an inorganic material.

19. The method of claim 18,
wherein the step of forming the at least one first insulating layer on the first surface of the semiconductor chip comprises forming a first upper insulating layer on the first surface of the semiconductor chip and forming a first lower insulating layer on the first upper insulating layer,
wherein the first upper insulating layer is the organic film including the plurality of ion trapping particles dispersed therein, and
wherein the first lower insulating layer comprises a photosensitive polymer film.

20. The method of claim 19,
wherein the first upper insulating layer is not a photosensitive film, and
wherein the first lower insulating layer does not include ion trap particles.

21. The semiconductor package of claim 1,
wherein the organic film comprises a first lower polymer film directly on a first upper polymer film,
wherein the first organic film is the first upper polymer film, the first upper polymer film comprising a first polymer material and the ion trapping particles,
wherein the first lower polymer film does not include ion trap particles, and
wherein the conductive redistribution patterns comprise a first conductive redistribution pattern disposed in a first opening, the first opening penetrating the first upper polymer film and the first lower polymer film.

22. The semiconductor package of claim 12,
wherein the at least one organic film comprises:
a first upper polymer film comprising a first polymer material in which the ion trapping particles of the filler are provided; and
a first lower polymer film directly on the first upper polymer film,
wherein the conductive redistribution patterns comprise a first conductive redistribution pattern disposed in a first opening, the first opening penetrating the first upper polymer film and the first lower polymer film, and
wherein the first conductive redistribution pattern comprises:
a seed pattern covering a bottom of the first opening, a sidewall of the first upper polymer film, and a sidewall of the first lower polymer film exposed by the first opening, and
a conductive pattern disposed on the seed pattern and filling the first opening.

23. The method of claim 18,
wherein the step of forming the at least one first insulating layer on the first surface of the semiconductor chip comprises forming a first upper insulating layer on the first surface of the semiconductor chip and forming a first lower insulating layer on the first upper insulating layer,
wherein the step of patterning comprising patterning the first upper insulating layer and the first lower insulating layer to expose the first chip pad of the semiconductor chip through corresponding openings in the first upper insulating layer and first lower insulating layer,
wherein the step of forming the first redistribution pattern comprises forming the first redistribution pattern on the first lower insulating layer, wherein the first upper insulating layer comprises an organic film including a plurality of ion trapping particles therein,
wherein the first via penetrates the first upper insulating layer and the first lower insulating layer, and
wherein the first upper insulating layer has a thickness less than 70% of the thickness of the first lower insulating layer.

* * * * *